(12) United States Patent
Yamazaki et al.

(10) Patent No.: US 10,185,190 B2
(45) Date of Patent: Jan. 22, 2019

(54) DISPLAY DEVICE, MODULE, AND ELECTRONIC DEVICE

(71) Applicant: Semiconductor Energy Laboratory Co., Ltd., Atsugi-shi, Kanagawa-ken (JP)

(72) Inventors: Shunpei Yamazaki, Setagaya (JP); Junichi Koezuka, Tochigi (JP); Natsuko Takase, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/584,239

(22) Filed: May 2, 2017

(65) Prior Publication Data

US 2017/0329162 A1    Nov. 16, 2017

(30) Foreign Application Priority Data

May 11, 2016   (JP) .................................. 2016-095254

(51) Int. Cl.
*G02F 1/1362* (2006.01)
*G02F 1/1333* (2006.01)
(Continued)

(52) U.S. Cl.
CPC ............ *G02F 1/1347* (2013.01); *G02F 1/136* (2013.01); *G02F 1/1362* (2013.01);
(Continued)

(58) Field of Classification Search
CPC ... G02F 2001/136218; G02F 1/136209; G02F 1/1362; G02F 1/133345; G02F 1/1347; H01L 29/78633; H01L 27/32
See application file for complete search history.

(56) References Cited

U.S. PATENT DOCUMENTS 5,952,708 A    9/1999  Yamazaki
5,969,463 A   10/1999  Tomita et al.
(Continued)

FOREIGN PATENT DOCUMENTS

JP        2015-072361 A    4/2015
JP        2015-223823 A   12/2015
WO     WO-2013/035298     3/2013

*Primary Examiner* — Jia X Pan
(74) *Attorney, Agent, or Firm* — Robinson Intellectual Property Law Office; Eric J. Robinson

(57) ABSTRACT

Display defects of a display device are reduced. The display quality of a display device is improved. A reliable display device is provided. A display device includes a substrate, a conductive layer over the substrate, and a transistor and a light-emitting element over the conductive layer. The transistor and the light-emitting element are each electrically insulated from the conductive layer. The transistor and the light-emitting element each overlap with the substrate with the conductive layer located therebetween. A constant potential is supplied to the conductive layer. The display device may further include a resin layer. In that case, the conductive layer overlaps with the substrate with the resin layer located therebetween. The resin layer has a thickness of more than or equal to 0.1 μm and less than or equal to 3 μm, for example. The resin layer has a 5% weight-loss temperature of lower than 400° C., for example.

24 Claims, 23 Drawing Sheets

(51) Int. Cl.
*G02F 1/1347* (2006.01)
*H01L 27/32* (2006.01)
*G02F 1/136* (2006.01)
*H01L 51/00* (2006.01)
*G02F 1/1337* (2006.01)

(52) U.S. Cl.
CPC .... *G02F 1/133345* (2013.01); *H01L 27/3276* (2013.01); *H01L 51/0097* (2013.01); *G02F 1/13338* (2013.01); *G02F 2001/133796* (2013.01); *G02F 2001/136218* (2013.01); *G09G 2300/0809* (2013.01); *H01L 2227/323* (2013.01); *H01L 2251/5338* (2013.01)

(56) References Cited

U.S. PATENT DOCUMENTS

| | | | |
|---|---|---|---|
| 5,990,542 | A | 11/1999 | Yamazaki |
| 6,127,199 | A | 10/2000 | Inoue et al. |
| 6,372,608 | B1 | 4/2002 | Shimoda et al. |
| 6,521,511 | B1 | 2/2003 | Inoue et al. |
| 6,645,830 | B2 | 11/2003 | Shimoda et al. |
| 6,707,614 | B2 | 3/2004 | Tanaka |
| 6,818,530 | B2 | 11/2004 | Shimoda et al. |
| 6,870,125 | B2 | 3/2005 | Doi et al. |
| 6,946,361 | B2 | 9/2005 | Takayama et al. |
| 7,050,835 | B2 | 5/2006 | Hack et al. |
| 7,094,665 | B2 | 8/2006 | Shimoda et al. |
| 7,285,476 | B2 | 10/2007 | Shimoda et al. |
| 7,468,308 | B2 | 12/2008 | Shimoda |
| 7,473,928 | B1 | 1/2009 | Yamazaki et al. |
| 7,591,863 | B2 | 9/2009 | Watanabe et al. |
| 7,709,309 | B2 | 5/2010 | Moriwaka |
| 7,726,013 | B2 | 6/2010 | Kimura |
| 7,791,072 | B2 | 9/2010 | Kumomi et al. |
| 7,968,388 | B2 | 6/2011 | Komatsu |
| 8,110,442 | B2 | 2/2012 | Jinbo |
| 8,199,269 | B2 | 6/2012 | Hattori et al. |
| 8,202,365 | B2 | 6/2012 | Umeda et al. |
| 8,211,725 | B2 | 7/2012 | Park et al. |
| 8,237,166 | B2 | 8/2012 | Kumomi et al. |
| 8,597,965 | B2 | 12/2013 | Hatano et al. |
| 8,969,128 | B2 | 3/2015 | Cho et al. |
| 9,202,827 | B2 | 12/2015 | Koyama et al. |
| 9,268,162 | B2 | 2/2016 | Haskal |
| 9,318,374 | B2 | 4/2016 | Atsumi et al. |
| 9,437,831 | B2 | 9/2016 | Yamazaki et al. |
| 9,443,888 | B2 | 9/2016 | Koyama et al. |
| 2002/0146893 | A1 | 10/2002 | Shimoda et al. |
| 2003/0025848 | A1* | 2/2003 | Sera .................. G02F 1/136209 349/43 |
| 2003/0032210 | A1 | 2/2003 | Takayama et al. |
| 2003/0144034 | A1 | 7/2003 | Hack et al. |
| 2004/0149989 | A1* | 8/2004 | Matsunaga ......... H01L 27/1218 257/59 |
| 2004/0209442 | A1 | 10/2004 | Takakuwa et al. |
| 2007/0182874 | A1* | 8/2007 | Kamijima ......... G02F 1/136209 349/44 |
| 2008/0042168 | A1 | 2/2008 | Watanabe et al. |
| 2008/0049437 | A1 | 2/2008 | Takayama et al. |
| 2008/0132033 | A1 | 6/2008 | Eguchi et al. |
| 2009/0269621 | A1 | 10/2009 | Lifka et al. |
| 2010/0073615 | A1 | 3/2010 | Yaguchi et al. |
| 2010/0163868 | A1 | 7/2010 | Yamazaki et al. |
| 2011/0084267 | A1 | 4/2011 | Yamazaki et al. |
| 2011/0156062 | A1 | 6/2011 | Kim et al. |
| 2011/0193077 | A1 | 8/2011 | Yamazaki |
| 2011/0294244 | A1 | 12/2011 | Hattori et al. |
| 2012/0034451 | A1 | 2/2012 | Seo et al. |
| 2012/0228617 | A1 | 9/2012 | Ko et al. |
| 2012/0249503 | A1* | 10/2012 | Teraguchi ............. H01L 27/322 345/206 |
| 2012/0280229 | A1 | 11/2012 | Suzuki et al. |
| 2013/0341629 | A1 | 12/2013 | Seo et al. |
| 2014/0113440 | A1 | 4/2014 | Tanaka et al. |
| 2014/0213071 | A1 | 7/2014 | Kawakami et al. |
| 2014/0220745 | A1 | 8/2014 | Watanabe et al. |
| 2014/0234664 | A1 | 8/2014 | Yasumoto et al. |
| 2014/0339517 | A1 | 11/2014 | Park et al. |
| 2015/0060778 | A1 | 3/2015 | Kim et al. |
| 2015/0151514 | A1 | 6/2015 | Kikuchi et al. |
| 2015/0210048 | A1 | 7/2015 | Jeong et al. |
| 2015/0303408 | A1 | 10/2015 | Lee et al. |
| 2016/0211267 | A1 | 7/2016 | Atsumi et al. |
| 2017/0294462 | A1 | 10/2017 | Yamazaki et al. |
| 2017/0294463 | A1 | 10/2017 | Yamazaki et al. |
| 2017/0309731 | A1 | 10/2017 | Yamazaki et al. |

\* cited by examiner

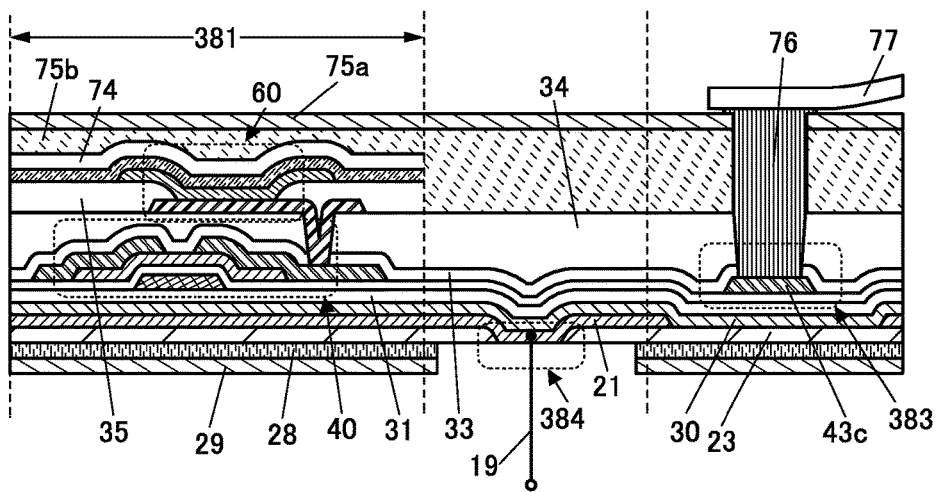
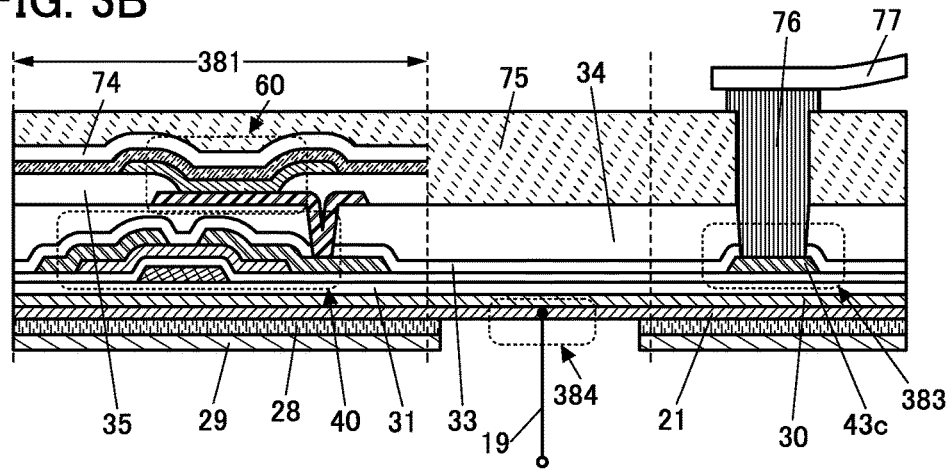

FIG. 12A
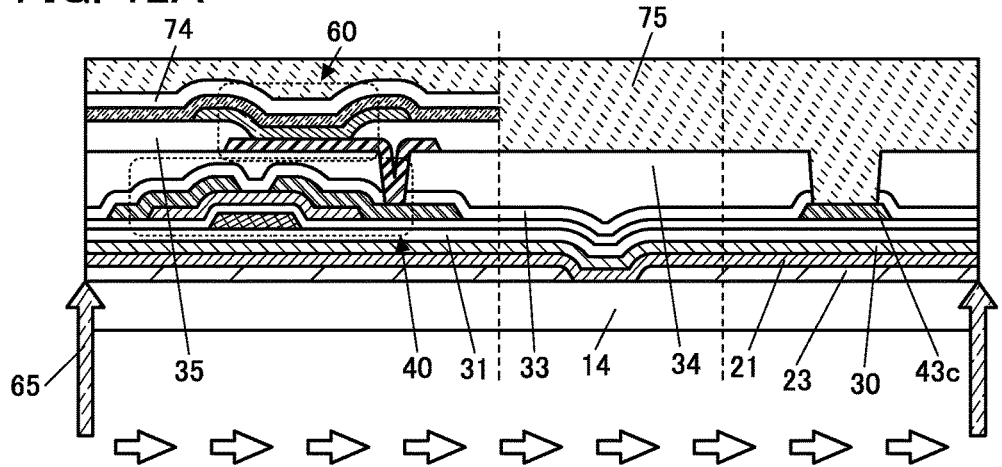
FIG. 12B1
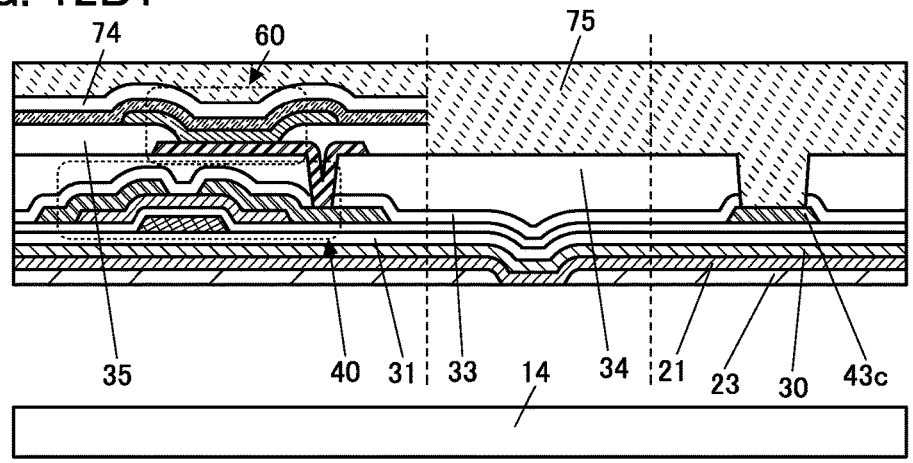
FIG. 12B2
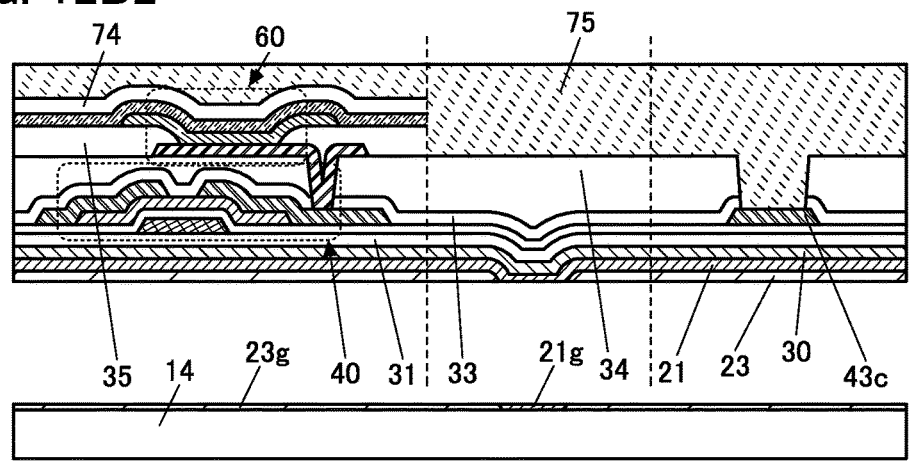

DISPLAY DEVICE, MODULE, AND ELECTRONIC DEVICE

BACKGROUND OF THE INVENTION

1. Field of the Invention

One embodiment of the present invention relates to a display device and a manufacturing method thereof. One embodiment of the present invention particularly relates to a flexible display device and a manufacturing method thereof. One embodiment of the present invention relates to a module and an electronic device each including a display device.

Note that one embodiment of the present invention is not limited to the above technical field. Examples of the technical field of one embodiment of the present invention include a semiconductor device, a display device, a light-emitting device, a power storage device, a memory device, an electronic device, a lighting device, an input device (such as a touch sensor), an input/output device (such as a touch panel), a method for driving any of them, and a method for manufacturing any of them.

2. Description of the Related Art

Display devices using organic electroluminescent (EL) elements or liquid crystal elements have been known. Examples of the display device also include a light-emitting device provided with a light-emitting element such as a light-emitting diode (LED), and electronic paper capable of performing display with an electrophoretic method or the like.

The organic EL element generally has a structure in which a layer containing a light-emitting organic compound is provided between a pair of electrodes. When voltage is applied to this element, light emission can be obtained from the light-emitting organic compound. With use of such an organic EL element, thin, lightweight, high-contrast, and low-power-consumption display devices can be achieved.

A flexible display device can be obtained by providing a semiconductor element such as a transistor and a display element such as an organic EL element over a flexible substrate (film).

Patent Document 1 discloses a method for manufacturing a flexible display device by providing a sacrificial layer, a heat-resistant resin layer, and electronic elements in this order over a supporting substrate (a glass substrate) and irradiating the supporting substrate with laser light to separate the heat-resistant resin layer from the glass substrate.

PATENT DOCUMENT

[Patent Document 1] Japanese Published Patent Application No. 2015-223823

SUMMARY OF THE INVENTION

An object of one embodiment of the present invention is to reduce display defects of a display device. An object of one embodiment of the present invention is to improve the display quality of a display device. An object of one embodiment of the present invention is to provide a display device with a curved surface. An object of one embodiment of the present invention is to provide a flexible display device. An object of one embodiment of the present invention is to provide a lightweight display device. An object of one embodiment of the present invention is to provide a thin display device. An object of one embodiment of the present invention is to provide a reliable display device. An object of one embodiment of the present invention is to provide a novel display device, a novel electronic device, or the like.

Note that the descriptions of these objects do not disturb the existence of other objects. In one embodiment of the present invention, there is not necessarily a need to achieve all the objects. Other objects can be derived from the description of the specification, the drawings, and the claims.

One embodiment of the present invention is a display device including a substrate, a first conductive layer over the substrate, and a transistor and a light-emitting element over the first conductive layer. The transistor and the light-emitting element are each electrically insulated from the first conductive layer and overlap with the substrate with the first conductive layer located therebetween. A constant potential is supplied to the first conductive layer.

One embodiment of the present invention is a display device including a substrate, a resin layer over the substrate, a first conductive layer over the resin layer, and a transistor and a light-emitting element over the first conductive layer. The transistor and the light-emitting element are each electrically insulated from the first conductive layer and overlap with the substrate with the first conductive layer located therebetween. The first conductive layer overlaps with the substrate with the resin layer located therebetween. A constant potential is supplied to the first conductive layer. The resin layer preferably has a thickness of more than or equal to 0.1 µm and less than or equal to 3 µm. The resin layer preferably has a 5% weight-loss temperature of lower than 400° C. The resin layer preferably has an opening. In that case, it is preferable that at least a portion of the first conductive layer be exposed through the opening in the resin layer. The substrate may also have an opening. In that case, a portion of the opening in the substrate may overlap with the opening in the resin layer. At least a portion of the first conductive layer may be exposed through the opening in the substrate.

In either of the above embodiments, the display device may include an inorganic insulating layer over the first conductive layer and include the transistor and the light-emitting element over the inorganic insulating layer.

One embodiment of the present invention is a display device including a substrate, a first resin layer over the substrate, a first conductive layer over the first resin layer, a second resin layer over the first conductive layer, and a transistor and a light-emitting element over the second resin layer. The transistor and the light-emitting element are each electrically insulated from the first conductive layer and overlap with the substrate with the first conductive layer located therebetween. The first conductive layer overlaps with the substrate with the first resin layer located therebetween. A constant potential is supplied to the first conductive layer. The display device may include a first inorganic insulating layer over the first conductive layer and include the second resin layer over the first inorganic insulating layer. The display device may include a second inorganic insulating layer over the second resin layer and include the transistor and the light-emitting element over the second inorganic insulating layer. The first resin layer preferably has a thickness of more than or equal to 0.1 µm and less than or equal to 3 µm. The first resin layer preferably has a 5% weight-loss temperature of lower than 400° C. The first resin layer preferably has an opening. In that case, it is preferable that at least a portion of the first conductive layer be exposed through the opening in the first resin layer. The substrate may also have an opening. In that case, a portion of the opening in the substrate may overlap with the opening in the first resin layer. At least a portion of the first conductive layer may be exposed through the opening in the substrate.

In each of the display devices of the above embodiments, the transistor preferably includes an oxide semiconductor in a channel formation region.

In each of the display devices of the above embodiments, the substrate preferably has flexibility.

In each of the display devices of the above embodiments, the first conductive layer preferably contains an oxide conductor.

One embodiment of the present invention is a module including any of the above display devices and a first connection wiring. The display device includes a second conductive layer. The second conductive layer is electrically insulated from the first conductive layer. The second conductive layer is electrically connected to the first connection wiring.

In the module of the above embodiment, the second conductive layer may overlap with the substrate with the first conductive layer located therebetween.

In the module of the above embodiment, the second conductive layer may overlap with the substrate with the first conductive layer not located therebetween.

The module of the above embodiment may include a flexible printed circuit board. The flexible printed circuit board includes a first connection wiring and a second connection wiring. The first conductive layer is electrically connected to the second connection wiring.

One embodiment of the present invention is an electronic device including the above-mentioned module and at least one of a sensor, an antenna, a battery, a housing, a camera, a speaker, a microphone, and an operation button.

According to one embodiment of the present invention, display defects of a display device can be reduced. According to one embodiment of the present invention, the display quality of a display device can be improved. According to one embodiment of the present invention, a display device with a curved surface can be provided. According to one embodiment of the present invention, a flexible display device can be provided. According to one embodiment of the present invention, a lightweight display device can be provided. According to one embodiment of the present invention, a thin display device can be provided. According to one embodiment of the present invention, a reliable display device can be provided. According to one embodiment of the present invention, a novel display device, a novel electronic device, or the like can be provided.

Note that the descriptions of these effects do not disturb the existence of other effects. In one embodiment of the present invention, there is not necessarily a need to achieve all the effects. Other effects can be derived from the description of the specification, the drawings, and the claims.

BRIEF DESCRIPTION OF THE DRAWINGS

FIGS. 3A and 3B are cross-sectional views each illustrating an example of a display device.

FIGS. 12A, 12B1, and 12B2 are cross-sectional views illustrating an example of a method for manufacturing a display device.

DETAILED DESCRIPTION OF THE INVENTION

Figure 1A:
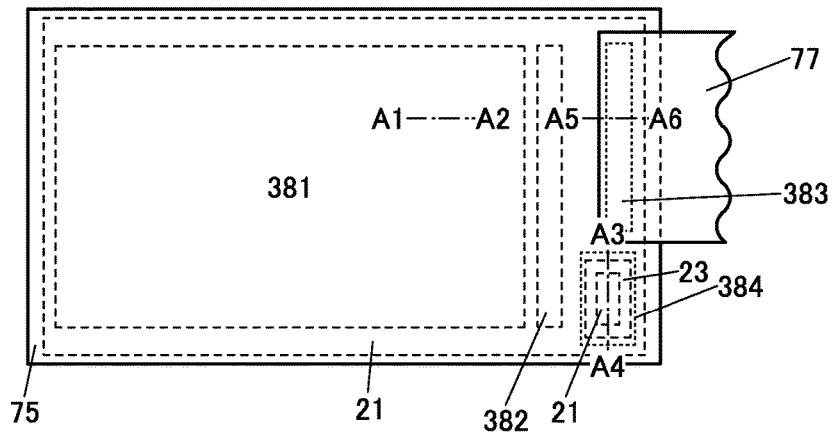
FIGS. 1A to 1C are a top view, a bottom view, and a cross-sectional view illustrating an example of a display device.

Embodiments will be described in detail with reference to the drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments.

Note that in the structures of the invention described below, the same portions or portions having similar functions are denoted by the same reference numerals in different drawings, and description of such portions is not repeated. Furthermore, the same hatch pattern is applied to similar functions, and these are not especially denoted by reference numerals in some cases.

In addition, the position, size, range, or the like of each structure illustrated in drawings is not accurately represented in some cases for easy understanding. Therefore, the disclosed invention is not necessarily limited to the position, size, range, or the like disclosed in the drawings.

Note that the terms "film" and "layer" can be interchanged with each other depending on the case or circumstances. For example, the term "conductive layer" can be changed into the term "conductive film." Also, the term "insulating film" can be changed into the term "insulating layer."

Embodiment 1

In this embodiment, a display device of one embodiment of the present invention will be described with reference to FIGS. 1A to 1C, FIGS. 2A to 2C, FIGS. 3A and 3B, FIGS. 4A to 4C, FIGS. 5A and 5B, FIGS. 6A and 6B, FIGS. 7A and 7B, and FIGS. 8A and 8B.

In this embodiment, a display device including a transistor and an organic EL element (such a display device is also referred to as an active-matrix organic EL display device) will be described as one example. The display device can be flexible when a flexible material is used for a substrate. Note that one embodiment of the present invention is not limited to a light-emitting device, a display device, and an input/output device (such as a touch panel) including organic EL elements and can be applied to a variety of devices such as a semiconductor device, a light-emitting device, a display device, and an input/output device including other functional elements.

One embodiment of the present invention is a display device including a substrate, a first conductive layer over the substrate, and a transistor and a light-emitting element over the first conductive layer. The transistor and the light-emitting element are each electrically insulated from the first conductive layer. The transistor and the light-emitting element each overlap with the substrate with the first conductive layer located therebetween. A constant potential is supplied to the first conductive layer.

In some cases where a display device and other electronic components (such as an integrated circuit (IC), a central processing unit (CPU), and a printed circuit board provided therewith) are placed in a housing of an electronic device, the display device may be subjected to noise due to operation of the electronic components (also referred to as unwanted radiation). This may cause defective operation of the display device. Specifically, the display device might have a display defect such as a luminance change. Similarly, the electronic components may be subjected to noise due to operation of the display device (unwanted radiation). This may cause defective operation of the electronic components.

In view of this, in the display device of one embodiment of the present invention, the first conductive layer to which a constant potential is supplied is positioned so as to overlap with the transistor and the light-emitting element. Since a constant potential is supplied to the first conductive layer, potential changes due to noise can be reduced. The first conductive layer blocks external noise; therefore, potential changes of conductive layers included in the transistor and the light-emitting element can be reduced. Thus, display defects of the display device can be reduced. Similarly, the first conductive layer reduces potential changes due to operation of the display device. This can suppress noise transmission from the display device to the other electronic components and occurrence of defective operation of the electronic components.

Examples of the constant potential include power supply potentials such as a low power supply potential (VSS) and a high power supply potential (VDD), a ground potential (GND potential), a common potential, a reference potential, and the like.

Since the display device includes the first conductive layer, there is no need to additionally provide a shield or the like for blocking noise in the housing of the electronic device, and the thickness, weight, and cost of the electronic device can be reduced. Even in the case where the display device includes the first conductive layer and a shield is additionally provided in the housing of the electronic device, noise can be surely blocked and the reliability of the electronic device can be improved as compared with the case where the display device does not include the first conductive layer.

In order to reduce the size of the electronic device, it is preferable to position the electronic components such as the IC on a side opposite to a display surface side of the display device (the side is also referred to as a rear surface side). The IC can be regarded as a source of noise because a large current flows in the IC. Therefore, it is preferable that the first conductive layer to which the constant potential is supplied be positioned on the rear surface side of the display device. With this structure, the transistor and the light-emitting element overlap with the electronic components such as the IC with the first conductive layer located therebetween, and the transistor and the light-emitting element are subjected to less noise from the electronic components.

The first conductive layer diffuses and releases static electricity (charge) generated or applied by a variety of causes during or after the manufacturing process of the display device, or prevents local existence (localization) of charge (so that a local potential difference is not generated), and can therefore prevent electrostatic discharge damage to the transistor and the light-emitting element.

The display device of one embodiment of the present invention includes a resin layer between the substrate and the first conductive layer.

The display device of one embodiment of the present invention preferably includes an oxide semiconductor in a channel formation region of the transistor.

In the case where low temperature polysilicon (LTPS) is used for the channel formation region of the transistor, the resin layer is required to have heat resistance because heat at a temperature of approximately 500° C. to 550° C. needs to be applied. Furthermore, the resin layer needs to have a large thickness so that damage in a step of laser crystallization can be reduced.

In contrast, a transistor including an oxide semiconductor can be formed at a temperature lower than or equal to 350° C., or even lower than or equal to 300° C. Therefore, the resin layer is not required to have high heat resistance. Accordingly, the heat resistant temperature of the resin layer can be low, and the range of choices for the materials can be expanded. Furthermore, the transistor including an oxide semiconductor does not need a laser crystallization step; thus, the resin layer can be thin. Since the resin layer is not required to have high heat resistance and can be thin, the manufacturing cost of a device can be significantly reduced. An oxide semiconductor is preferably used, in which case the steps can be simplified as compared with the case where LTPS is used.

The resin layer in one embodiment of the present invention has a thickness of greater than or equal to 0.1 μm and less than or equal to 3 μm. By forming the resin layer thin, the display device can be manufactured at low cost. The display device can be lightweight and thin. The display device can have higher flexibility.

The heat resistance of the resin layer can be measured by, for example, heat-induced weight loss percentage, specifically, 5% weight loss temperature. In one embodiment of the present invention, the 5% weight loss temperature of the resin layer can be lower than or equal to 450° C., lower than or equal to 400° C., lower than 400° C., or lower than 350° C.

In one embodiment of the present invention, the resin layer is formed using a photosensitive material. With the photosensitive material, a resin layer of a desired shape can be easily formed. For example, a resin layer having an opening or a resin layer having two or more regions with different thicknesses can be easily formed. Accordingly, the resin layer can be prevented from hindering formation of an external connection terminal, a through electrode, or the like.

Structures of the display device of one embodiment of the present invention will be specifically described below. Note that materials that can be used for the display device of this embodiment and methods for manufacturing the display device will be described in Embodiment 2.

Structural Example 1

Figure 1B:
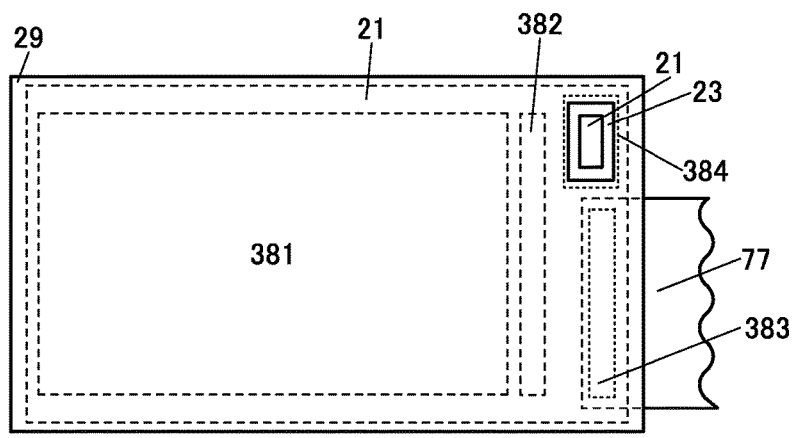
Figure 1C:
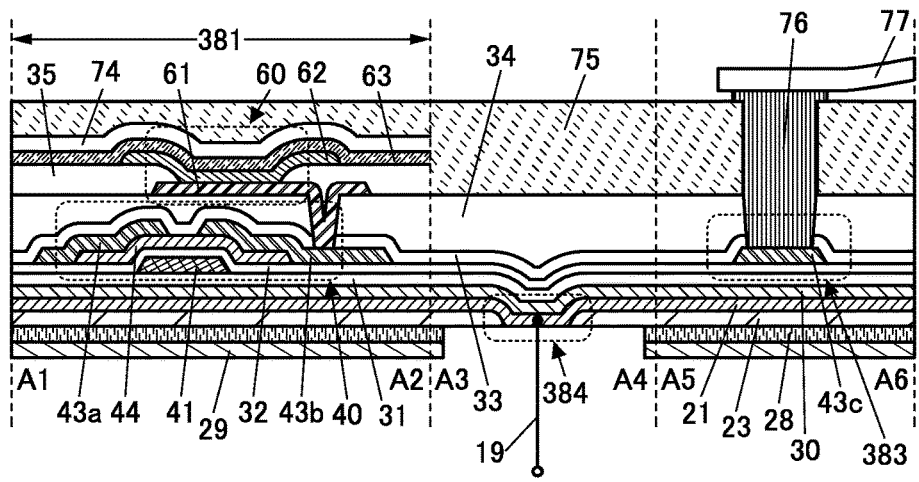

FIG. 1A is a top view of the display device, and FIG. 1B is a bottom view of the display device. FIG. 1A illustrates a display surface side of the display device, and FIG. 1B illustrates a side opposite to the display surface side of the display device (the side is hereinafter also referred to as a rear surface side). FIG. 1C is a cross-sectional view including a display portion 381, a connection portion 383, and a connection portion 384 of the display device.

The display device illustrated in FIGS. 1A and 1B includes the display portion 381 and a driver circuit portion 382. An FPC 77 is attached to the display surface side of the display device. As illustrated in FIG. 1B, a substrate 29 has an opening, through which a resin layer 23 and a conductive layer 21 are exposed on the rear surface side of the display device.

The conductive layer 21 is provided in the display portion 381, the driver circuit portion 382, and the connection portion 384. The conductive layer 21 overlaps with the connection portion 383 and is electrically insulated from the connection portion 383.

The display device illustrated in FIG. 1C is a top-emission display device employing a separate coloring method.

The display device in FIG. 1C includes the substrate 29, a bonding layer 28, the resin layer 23, the conductive layer 21, an insulating layer 30, an insulating layer 31, a transistor 40, a conductive layer 43c, an insulating layer 33, an insulating layer 34, an insulating layer 35, a display element 60, an insulating layer 74, and a protective layer 75.

Methods for manufacturing the display device in FIG. 1C will be described in a manufacturing method example 1 and a manufacturing method example 2 in Embodiment 2.

The substrate 29 is attached to the conductive layer 21 with the bonding layer 28. At least a portion of the conductive layer 21 is exposed without overlapping with the substrate 29. In the display device, the exposed portion of the conductive layer 21 functions as the connection portion 384 and is connected to a connection wiring 19. For example, a constant potential can be supplied to the conductive layer 21 from the connection wiring 19.

As described above, the resin layer 23 can be formed using a photosensitive material. Therefore, the conductive layer 21 and the connection wiring 19 can be electrically connected to each other through the opening provided in the resin layer 23.

As the connection wiring 19, a conductive tape, a cable, or the like can be used, for example. When the connection wiring 19 is used to electrically connect the conductive layer 21 to a GND line in a housing, a GND potential can be supplied to the conductive layer 21.

A wiring included in a connector such as a flexible printed circuit (FPC) board or a tape carrier package (TCP) can also be used as the connection wiring 19. Such a wiring can be electrically connected to the conductive layer 21 using an anisotropic conductive film (ACF) or an anisotropic conductive paste (ACP).

For the conductive layer 21, a variety of conductive materials such as an oxide semiconductor, an oxide conductor (including an oxide semiconductor with increased defect states or impurity states), a metal, an alloy, a conductive paste, and a conductive polymer can be used.

As the substrate 29, a resin film can be favorably used. For the bonding layer 28, any of a variety of curable adhesives can be used.

The display portion 381 includes the transistor 40.

The structure of the transistor in the display device is not particularly limited. For example, a planar transistor, a forward staggered transistor, or an inverted staggered transistor may be used. A top-gate transistor or a bottom-gate transistor may be used. Alternatively, gate electrodes may be provided above and below a channel.

The transistor 40 includes a conductive layer 41, an insulating layer 32, an oxide semiconductor layer 44, and conductive layers 43a and 43b. The conductive layer 41 functions as a gate. The insulating layer 32 functions as a gate insulating layer. The conductive layer 41 overlaps with the oxide semiconductor layer 44 with the insulating layer 32 located therebetween. The conductive layers 43a and 43b are connected to the oxide semiconductor layer 44. One of the conductive layers 43a and 43b functions as a source, and the other functions as a drain.

As described above, since an oxide semiconductor is used for a channel formation region of the transistor in one embodiment of the present invention, the transistor can be manufactured at low temperature without laser irradiation. Therefore, the resin layer 23 is not required to have high heat resistance and a large thickness. Therefore, the resin layer 23 can be thin. Accordingly, the display device can be manufactured at low cost. The display device can be lightweight and thin. The display device can have higher flexibility.

The resin layer 23 preferably has a thickness greater than or equal to 0.01 µm and less than 10 µm, further preferably greater than or equal to 0.1 µm and less than or equal to 3 µm, still further preferably greater than or equal to 0.5 µm and less than or equal to 1 µm. When the resin layer 23 has a thickness in the above range, the display device can have higher flexibility. The thickness of the resin layer 23 is not limited thereto, and may be greater than or equal to 10 µm. For example, the resin layer 23 may have a thickness greater than or equal to 10 µm and less than or equal to 200 µm. The resin layer 23 having a thickness greater than or equal to 10 µm is favorable because the rigidity of the display device can be increased.

It is preferable that at least one of the insulating layers 30 and 31 be formed using a material through which impurities such as water and hydrogen do not diffuse easily. Similarly, it is preferable that at least one of the insulating layers 33 and 34 be formed using a material through which impurities such as water and hydrogen do not diffuse easily. Diffusion of impurities into the transistor from the outside can be effectively inhibited, leading to improved reliability of the display device. The insulating layer 34 functions as a planarization layer.

Any of a variety of display elements can be used in the display device of one embodiment of the present invention.

For example, a light-emitting element, a liquid crystal element, an electrophoretic element, a display element using micro electro mechanical systems (MEMS), or the like may be used. As the light-emitting element, a self-luminous element can be used, and an element whose luminance is controlled by current or voltage is included in the category of the light-emitting element. For example, a light-emitting diode (LED), an organic EL element, an inorganic EL element, or the like can be used.

In this embodiment, an example of using an organic EL element, which is an example of a light-emitting element, as the display element 60 is described. The display element 60 includes a conductive layer 61, an EL layer 62, and a conductive layer 63. The display element 60 emits light to the protective layer 75 side.

The transistor, a capacitor, a wiring, and the like are positioned so as to overlap with a light-emitting region of the light-emitting element; accordingly, the aperture ratio of the display portion 381 can be increased.

One of the conductive layers 61 and 63 functions as an anode, and the other functions as a cathode. When a voltage higher than the threshold voltage of the light-emitting element is applied between the conductive layer 61 and the conductive layer 63, holes are injected into the EL layer 62 from the anode side and electrons are injected into the EL layer 62 from the cathode side. The injected electrons and holes are recombined in the EL layer 62 and a light-emitting substance contained in the EL layer 62 emits light.

The conductive layer 61 is electrically connected to the source or the drain of the transistor 40 directly or through a conductive layer. In FIG. 1C, the conductive layer 61 is directly connected to the conductive layer 43b. The conductive layer 61 functioning as a pixel electrode is provided for each light-emitting element. Two adjacent conductive layers 61 are electrically insulated from each other by the insulating layer 35.

The EL layer 62 contains a light-emitting material. As the light-emitting element, an organic EL element including an organic compound as a light-emitting material can be favorably used.

The EL layer 62 includes at least one light-emitting layer. In addition to the light-emitting layer, the EL layer 62 can further include a layer containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

Either a low molecular compound or a high molecular compound can be used for the EL layer 62, and an inorganic compound may also be included.

The conductive layer 63 functioning as a common electrode is shared by a plurality of light-emitting elements. A constant potential is supplied to the conductive layer 63.

Here, the display element 60 is preferably positioned within 10 μm, further preferably within 5 μm, still further preferably within 2.5 μm, from a neutral plane.

A region having low adhesion may be generated in the display element 60 in the case where an EL element is used as the display element 60, for example. Stress applied to the display element 60 can be reduced by positioning the display element 60 close to the neutral plane. In addition, in a separation step in manufacturing the display device or in the use of the display device in a bent state, for example, occurrence of film separation can be suppressed.

Note that one embodiment of the present invention is not limited to the separate coloring method, and a color filter method, a color conversion method, a quantum dot method, and the like may be employed.

The conductive layer 43c can be formed using the same material and in the same process as those of conductive layers included in the transistor. For example, the conductive layer 43c can be formed using the same material and in the same process as those of the conductive layers 43a and 43b. The conductive layer 43c is electrically connected to an external input terminal through which a signal and a potential from the outside are transmitted to the driver circuit portion 382. Here, an example in which the FPC 77 is provided as the external input terminal is described. The FPC 77 is electrically connected to the conductive layer 43c through a connector 76.

As the connector 76, any of various anisotropic conductive films, anisotropic conductive pastes, and the like can be used.

The insulating layer 74 functions as a protective layer that suppresses diffusion of impurities such as water into the display element 60. The display element 60 is sealed with the insulating layer 74.

The insulating layer 74 and the insulating layer 31 are preferably highly resistant to moisture. The display element 60, the transistor 40, and the like are preferably provided between a pair of insulating layers which are highly resistant to moisture, in which case impurities such as water can be prevented from entering these elements, leading to an increase in the reliability of the display device.

Examples of the insulating layers which are highly resistant to moisture include a film containing nitrogen and silicon (e.g., a silicon nitride film and a silicon nitride oxide film), a film containing nitrogen and aluminum (e.g., an aluminum nitride film), and the like. Alternatively, a silicon oxide film, a silicon oxynitride film, an aluminum oxide film, or the like may be used.

For example, the moisture vapor transmission rate of the insulating layers which are highly resistant to moisture is lower than or equal to $1\times10^{-5}$ [g/(m$^2$·day)], preferably lower than or equal to $1\times10^{-6}$ [g/(m$^2$·day)], further preferably lower than or equal to $1\times10^{-7}$ [g/(m$^2$·day)], still further preferably lower than or equal to $1\times10^{-8}$ [g/(m$^2$·day)].

The protective layer 75 can be used as a layer positioned as the outermost surface of the display device. The protective layer 75 preferably has a high visible-light transmitting property. An organic insulating film can be favorably used as the protective layer 75. In the protective layer 75, the organic insulating film and a hard coat layer (e.g., a silicon nitride layer) for protecting a surface from damage or the like, a layer formed of a material that can disperse pressure (e.g., an aramid resin layer), or the like may be stacked.

Structural Example 2

Figure 2A:
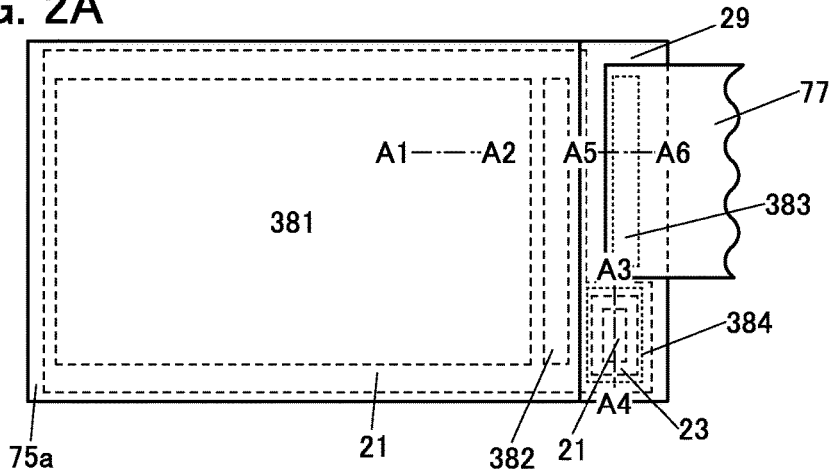
FIGS. 2A to 2C are a top view, a bottom view, and a cross-sectional view illustrating an example of a display device.
Figure 2B:
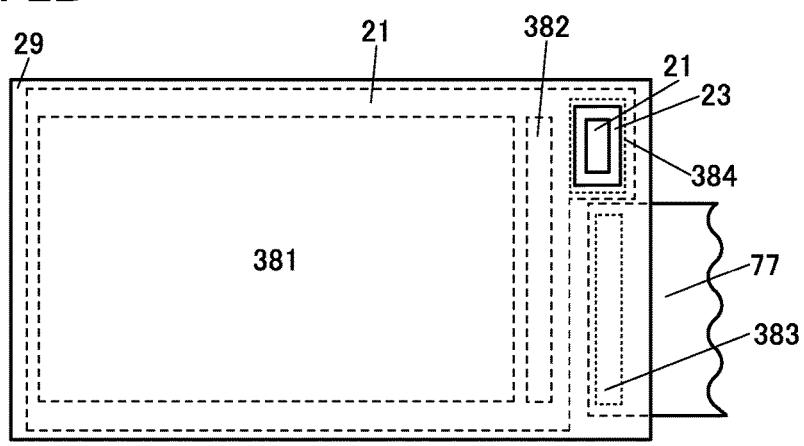
Figure 2C:
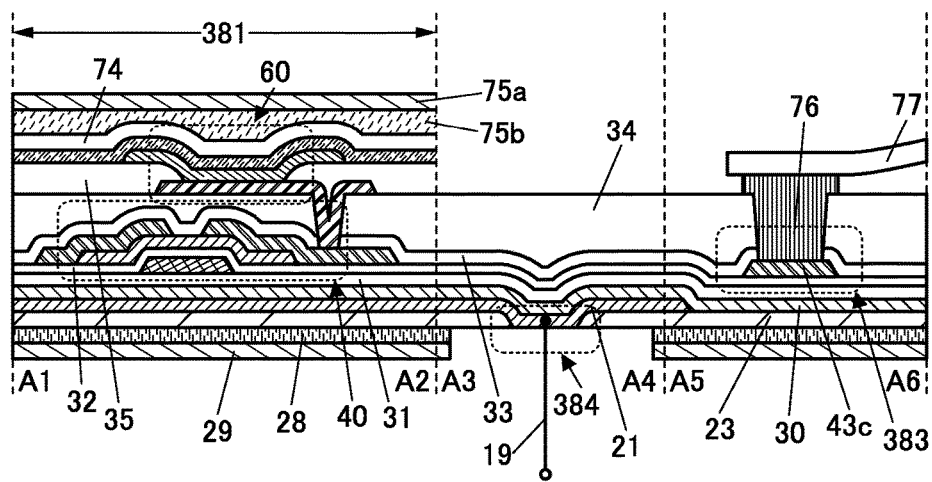

FIG. 2A is a top view of the display device, and FIG. 2B is a bottom view of the display device. FIG. 2A illustrates a display surface side of the display device, and FIG. 2B illustrates a rear surface side of the display device. FIG. 2C is a cross-sectional view including the display portion 381, the connection portion 383, and the connection portion 384 of the display device.

Note that in this and following structural examples and modification examples, portions similar to those in the above structural example or modification example will not be described in detail.

The display device illustrated in FIGS. 2A and 2B includes the display portion 381 and the driver circuit portion 382. The FPC 77 is attached to the display surface side of the display device. As illustrated in FIG. 2B, the substrate 29 has an opening, through which the resin layer 23 and the conductive layer 21 are exposed on the rear surface side of the display device.

The conductive layer 21 is provided in the display portion 381, the driver circuit portion 382, and the connection portion 384. The conductive layer 21 is positioned so as not to overlap with the connection portion 383.

The display device illustrated in FIG. 2C is a top-emission display device employing a separate coloring method.

The display device in FIG. 2C includes the substrate 29, the bonding layer 28, the resin layer 23, the conductive layer 21, the insulating layer 30, the insulating layer 31, the transistor 40, the conductive layer 43c, the insulating layer 33, the insulating layer 34, the insulating layer 35, the display element 60, the insulating layer 74, a bonding layer 75b, and a substrate 75a.

As illustrated in FIG. 2A, the substrate 75a is smaller than the substrate 29. The connection portion 383 and the connection portion 384 are each positioned so as not to overlap with the substrate 75a.

As illustrated in FIG. 2C, the conductive layer 43c is connected to the connector 76 through an opening in the insulating layer 33 and the insulating layer 34. Accordingly, the conductive layer 43c is electrically connected to the FPC 77. Since the substrate 75a and the substrate 29 have different sizes, the conductive layer 43c can be electrically connected to the FPC 77 easily. Specifically, the step of removing portions of the bonding layer 75b and the substrate 75a (e.g., the step of providing an opening) can be eliminated.

In the connection portion 383, at the time of pressure bonding of the FPC 77, force tends to be applied to regions of the insulating layer 30, the insulating layer 31, and the insulating layer 32 in the vicinity of the conductive layer 43c, and a crack may be caused therein. Therefore, it is preferable that the conductive layer 21 not be provided in the connection portion 383. In that case, it is possible to prevent a short circuit due to electrical connection of the conductive layer 43c and the conductive layer 21 to each other through a crack in the insulating layers.

As the substrate 75a, a resin film can be favorably used. For the bonding layer 75b, any of a variety of curable adhesives can be used.

Modification Example 1

The display device illustrated in FIG. 3A differs from the display device illustrated in FIG. 2C in that the connector 76 and the conductive layer 43c are connected to each other through an opening provided in the substrate 75a, the bonding layer 75b, the insulating layer 34, and the insulating layer 33.

The conductive layer 43c can be exposed and electrically connected to the FPC 77 by using a substrate having an opening as the substrate 75a or by forming an opening in the substrate 75a and the bonding layer 75b.

Modification Example 2

The display device illustrated in FIG. 3B differs from the display device illustrated in FIG. 1C in not including the resin layer 23. A method for manufacturing the display device in FIG. 3B will be described in a manufacturing method example 3 in Embodiment 2.

The substrate 29 is attached to the conductive layer 21 with the bonding layer 28. At least a portion of the conductive layer 21 is exposed without overlapping with the substrate 29. In the display device, the exposed portion of the conductive layer 21 functions as the connection portion 384 and is connected to the connection wiring 19. For example, a constant potential can be supplied to the conductive layer 21 from the connection wiring 19.

Modification Example 3

Figure 4A:
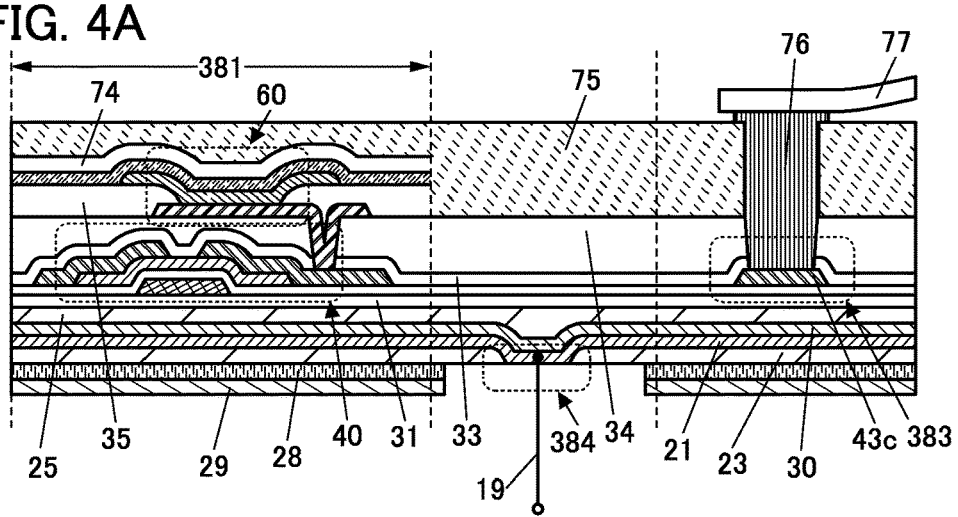
FIGS. 4A to 4C are cross-sectional views each illustrating an example of a display device.

The display device illustrated in FIG. 4A differs from the display device illustrated in FIG. 1C in including a resin layer 25.

The resin layer 25 preferably has a planarizing function, in which case a flat surface can be formed over steps due to the resin layer 23 and thus film formation in a later step can be easily performed.

Modification Example 4

Figure 4B:
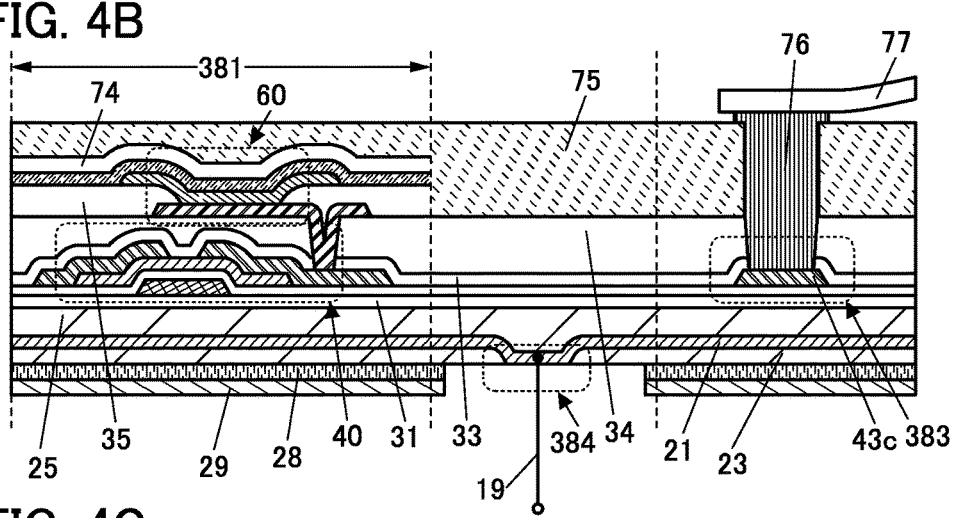

The display device illustrated in FIG. 4B differs from the display device illustrated in FIG. 1C in including the resin layer 25 and not including the insulating layer 30.

Modification Example 5

Figure 4C:
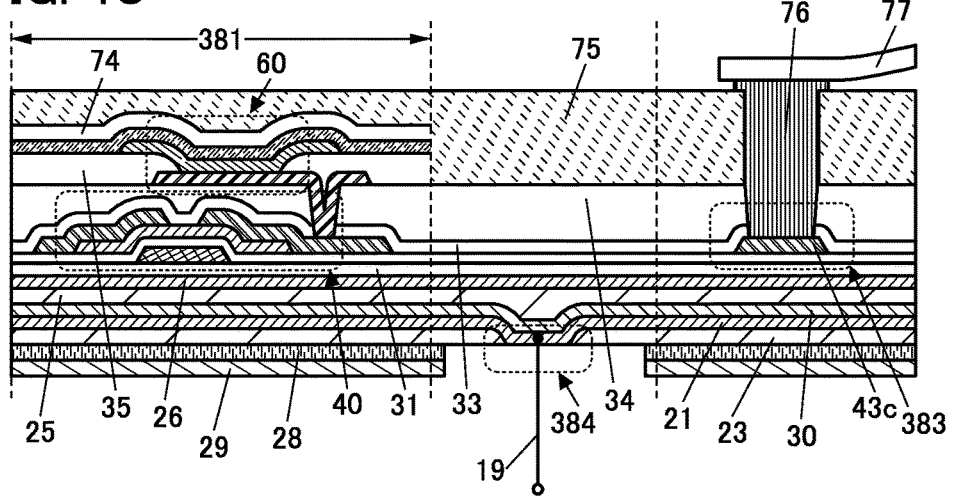

The display device illustrated in FIG. 4C differs from the display device illustrated in FIG. 1C in including the resin layer 25 and an insulating layer 26.

An insulating layer which is highly resistant to moisture is preferably formed as the insulating layer 26 over the resin layer 25, in which case impurities such as water can be prevented from entering functional elements formed over the insulating layer 26, leading to an increase in the reliability of the display device.

Structural Example 3

Figure 5A:
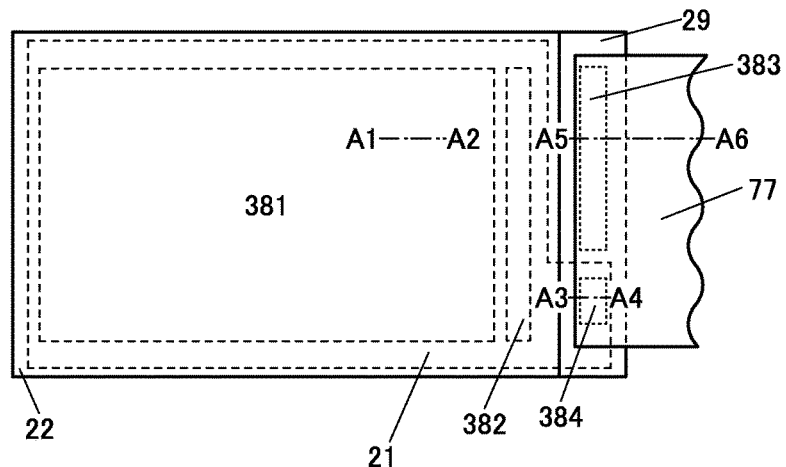
FIGS. 5A and 5B are a top view and a cross-sectional view illustrating an example of a display device.
Figure 5B:
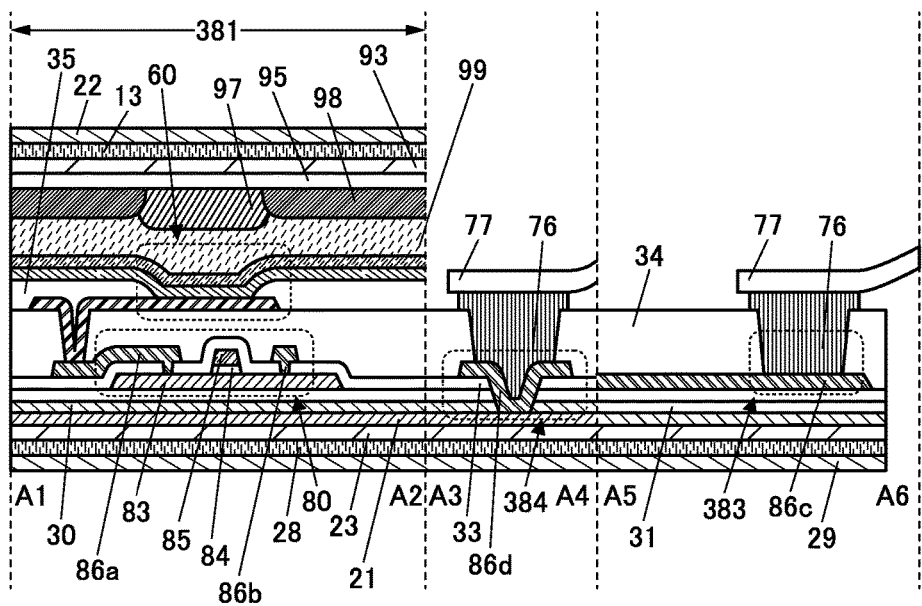

FIG. 5A is a top view of the display device. FIG. 5A illustrates a display surface side of the display device. FIG. 5B is a cross-sectional view including the display portion 381, the connection portion 383, and the connection portion 384 of the display device.

The display device illustrated in FIG. 5A includes the display portion 381 and the driver circuit portion 382. The FPC 77 is attached to the display surface side of the display device.

The conductive layer 21 is provided in the display portion 381, the driver circuit portion 382, and the connection portion 384. The conductive layer 21 is positioned so as not to overlap with the connection portion 383.

The display device illustrated in FIG. 5B is a top-emission display device employing a color filter method.

The display device in FIG. 5B includes the substrate 29, the bonding layer 28, the resin layer 23, the conductive layer 21, the insulating layer 30, the insulating layer 31, a transistor 80, a conductive layer 86c, a conductive layer 86d, the insulating layer 33, the insulating layer 34, the insulating layer 35, the display element 60, a bonding layer 99, a coloring layer 97, a light-blocking layer 98, a substrate 22, a bonding layer 13, a resin layer 93, and an insulating layer 95.

The display portion 381 includes the transistor 80.

The transistor 80 includes an oxide semiconductor layer 83, an insulating layer 84, a conductive layer 85, and conductive layers 86a and 86b. The conductive layer 85 functions as a gate. The insulating layer 84 functions as a gate insulating layer. The conductive layer 85 overlaps with the oxide semiconductor layer 83 with the insulating layer 84 located therebetween. One of the conductive layers 86a and 86b is electrically connected to a source region of the oxide semiconductor layer 83, and the other is electrically connected to a drain region of the oxide semiconductor layer 83.

As described above, since an oxide semiconductor is used for a channel formation region of the transistor in one embodiment of the present invention, the resin layer 23 is not required to have high heat resistance and a large thickness. Therefore, the resin layer 23 can be thin. Accordingly, the display device can be manufactured at low cost. The display device can be lightweight and thin. The display device can have higher flexibility. The same applies to the resin layer 93.

The resin layer 23 and the resin layer 93 each preferably have a thickness greater than or equal to 0.01 μm and less than 10 μm, further preferably greater than or equal to 0.1 μm and less than or equal to 3 μm, still further preferably greater than or equal to 0.5 μm and less than or equal to 1 μm. The thickness of each of the resin layers 23 and 93 may be greater than or equal to 10 μm.

The conductive layer 86c and the conductive layer 86d can be formed using the same material and in the same process as those of conductive layers included in the transistor. For example, the conductive layer 86c and the conductive layer 86d can be formed using the same material and in the same process as those of the conductive layers 86a and 86b.

The conductive layer 86c is electrically connected to an external input terminal through which a signal and a potential from the outside are transmitted to the driver circuit portion 382. Here, an example in which the FPC 77 is provided as the external input terminal is described. In the connection portion 383, the conductive layer 86c is electrically connected to a first connection wiring included in the FPC 77 through the connector 76.

In the connection portion 384, the conductive layer 21 is electrically connected to a second connection wiring included in the FPC 77 through the conductive layer 86d and the connector 76. A constant potential is supplied to the conductive layer 21 from the second connection wiring.

The conductive layer 86c and the conductive layer 21 are electrically insulated from each other. In this structure, a signal or a potential can be supplied to the conductive layer 86c and the conductive layer 21 using the single FPC 77. Therefore, the number of components can be decreased.

In FIG. 5B, no opening needs to be formed in the resin layer 23. A material of the resin layer 23 is not limited to a photosensitive material.

The display element 60 overlaps with the coloring layer 97 with the bonding layer 99 located therebetween. The insulating layer 35 overlaps with the light-blocking layer 98 with the bonding layer 99 located therebetween.

The coloring layer 97 is a coloring layer that transmits light in a specific wavelength range. For example, a color filter for transmitting light in a red, green, blue, or yellow wavelength range can be used. Examples of materials that can be used for the coloring layer 97 include a metal material, a resin material, a resin material containing a pigment or a dye, and the like.

The light-blocking layer 98 is provided between the coloring layer 97 and an adjacent coloring layer. The light-blocking layer 98 blocks light emitted from an adjacent light-emitting element to inhibit color mixture between adjacent light-emitting elements. Here, the coloring layer 97 is provided such that its end portion overlaps with the light-blocking layer 98, whereby light leakage can be reduced. For the light-blocking layer 98, a material that blocks light emitted from the light-emitting element can be used. For example, a black matrix can be formed using a metal material or a resin material containing a pigment or a dye. Note that it is preferable to provide the light-blocking layer 98 in a region other than the display portion 381, such as the driver circuit portion 382, in which case undesired leakage of guided light or the like can be inhibited.

The resin layer 23 and the substrate 29 are attached to each other with the bonding layer 28. In addition, the resin layer 93 and the substrate 22 are attached to each other with the bonding layer 13.

As each of the substrates 22 and 29, a resin film can be favorably used. For each of the bonding layers 13, 99, and 28, any of a variety of curable adhesives can be used.

The insulating layer 95 and the insulating layer 31 are preferably highly resistant to moisture. The display element 60, the transistor 80, and the like are preferably provided between a pair of insulating layers which are highly resistant to moisture, in which case impurities such as water can be prevented from entering these elements, leading to an increase in the reliability of the display device.

Structural Example 4

Figure 6A:
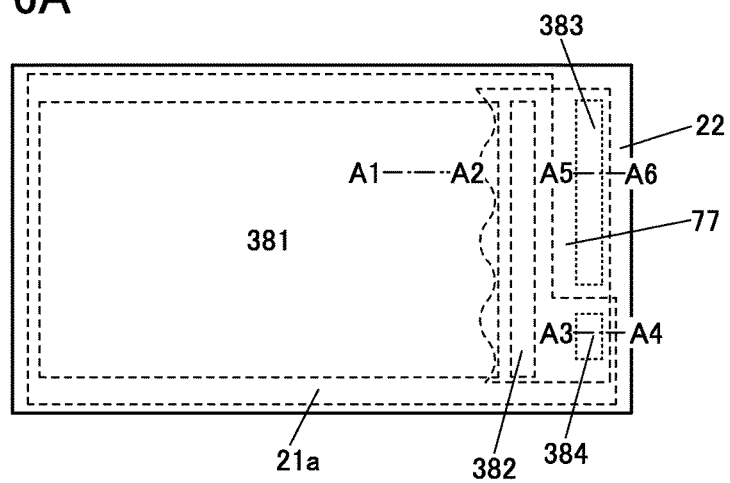
FIGS. 6A and 6B are a top view and a cross-sectional view illustrating an example of a display device.
Figure 6B:
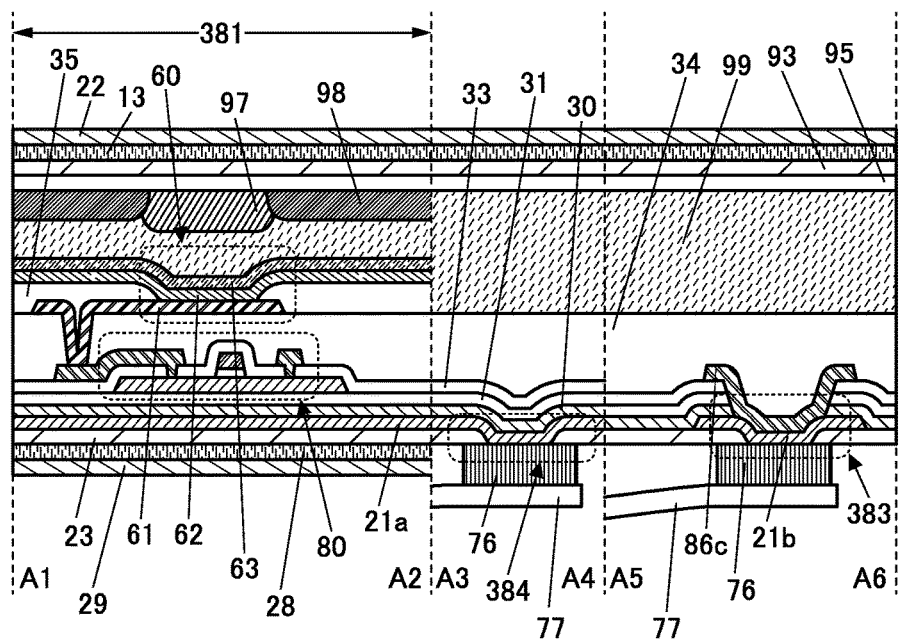

FIG. 6A is a top view of the display device. FIG. 6A illustrates a display surface side of the display device. FIG. 6B is a cross-sectional view including the display portion 381, the connection portion 383, and the connection portion 384 of the display device.

The display device illustrated in FIG. 6A includes the display portion 381 and the driver circuit portion 382. The FPC 77 is attached to a side opposite to the display surface side of the display device.

A conductive layer 21a is provided in the display portion 381, the driver circuit portion 382, and the connection portion 384. The conductive layer 21a is positioned so as not to overlap with the connection portion 383. Note that a conductive layer 21b is provided in the connection portion 383 (not illustrated in FIG. 6A).

The display device illustrated in FIG. 6B is a top-emission display device employing a color filter method.

A method for manufacturing the display device in FIG. 6B will be described in a manufacturing method example 4 in Embodiment 2.

The display portion 381 illustrated in FIG. 6B has a structure similar to that in FIG. 5B.

The conductive layer 86c can be formed using the same material and in the same process as those of conductive layers included in the transistor. For example, the conductive layer 86c can be formed using the same material and in the same process as those of the conductive layers 86a and 86b.

The conductive layer 21a and the conductive layer 21b can be formed using the same material and in the same process. The conductive layer 21a and the conductive layer 21b are electrically insulated from each other.

The conductive layer 86c is electrically connected to an external input terminal through which a signal and a potential from the outside are transmitted to the driver circuit portion 382. Here, an example in which the FPC 77 is provided as the external input terminal is described. In the connection portion 383, the conductive layer 86c is electrically connected to the first connection wiring included in the FPC 77 through the conductive layer 21b and the connector 76.

In the connection portion 384, the conductive layer 21a is electrically connected to the second connection wiring included in the FPC 77 through the connector 76. A constant potential is supplied to the conductive layer 21a from the second connection wiring.

In this structure, a signal or a potential can be supplied to the conductive layer 21a and the conductive layer 86c using the single FPC 77. Therefore, the number of components can be decreased.

As described above, the resin layer 23 can be formed using a photosensitive material. Therefore, the conductive layer 86c and the FPC 77 can be electrically connected to each other through the opening provided in the resin layer 23. Similarly, the conductive layer 21a and the FPC 77 can be electrically connected to each other through the opening provided in the resin layer 23. With such a structure, the FPC 77 can be positioned on the side opposite to the display surface side. Thus, a space for bending the FPC 77 in incorporating the display device in an electronic device can be eliminated, which enables the electronic device to be smaller. In addition, the conductive layer 86c and the conductive layer 21a do not need to be exposed on the substrate 22 side. Thus, the steps can be simplified.

Structural Example 5

Figure 7A:
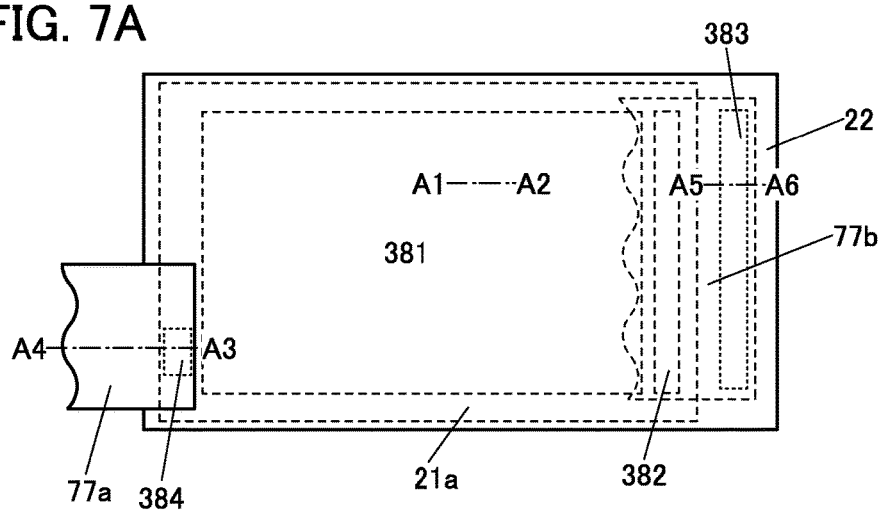
FIGS. 7A and 7B are a top view and a cross-sectional view illustrating an example of a display device.
Figure 7B:
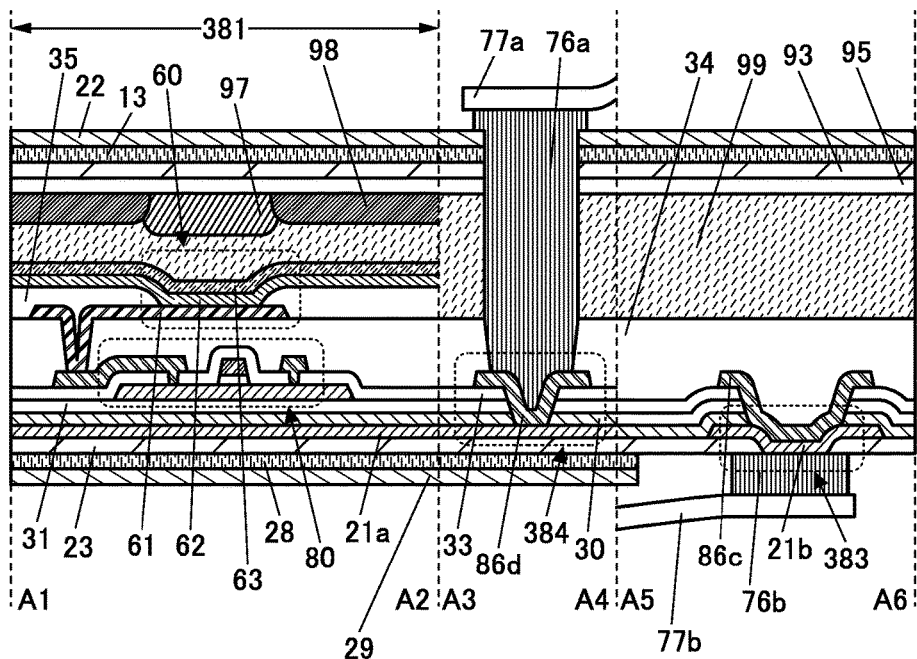

FIG. 7A is a top view of the display device. FIG. 7A illustrates a display surface side of the display device. FIG. 7B is a cross-sectional view including the display portion 381, the connection portion 383, and the connection portion 384 of the display device.

The display device illustrated in FIG. 7A includes the display portion 381 and the driver circuit portion 382. FPCs are attached to both the display surface side and the rear surface side of the display device.

The conductive layer 21a is provided in the display portion 381, the driver circuit portion 382, and the connection portion 384. The conductive layer 21a is positioned so as not to overlap with the connection portion 383. Note that the conductive layer 21b is provided in the connection portion 383 (not illustrated in FIG. 7A).

The display device illustrated in FIG. 7B is a top-emission display device employing a color filter method.

The display portion 381 illustrated in FIG. 7B has a structure similar to that in FIG. 5B.

The conductive layer 86c and the conductive layer 86d can be formed using the same material and in the same process as those of conductive layers included in the transistor. For example, the conductive layer 86c and the conductive layer 86d can be formed using the same material and in the same process as those of the conductive layers 86a and 86b.

The conductive layer 21a and the conductive layer 21b can be formed using the same material and in the same process. The conductive layer 21a and the conductive layer 21b are electrically insulated from each other.

In the connection portion 383, the conductive layer 86c is electrically connected to an external input terminal through which a signal and a potential from the outside are transmitted to the driver circuit portion 382. Here, an example in which an FPC 77b is provided as the external input terminal is described. In the connection portion 383, the conductive layer 86c is electrically connected to the FPC 77b through the conductive layer 21b and a connector 76b.

In the connection portion 384, the conductive layer 21a is electrically connected to an FPC 77a through the conductive layer 86d and a connector 76a. A constant potential is supplied to the conductive layer 21a from the FPC 77a.

Structural Example 6

Figure 8A:
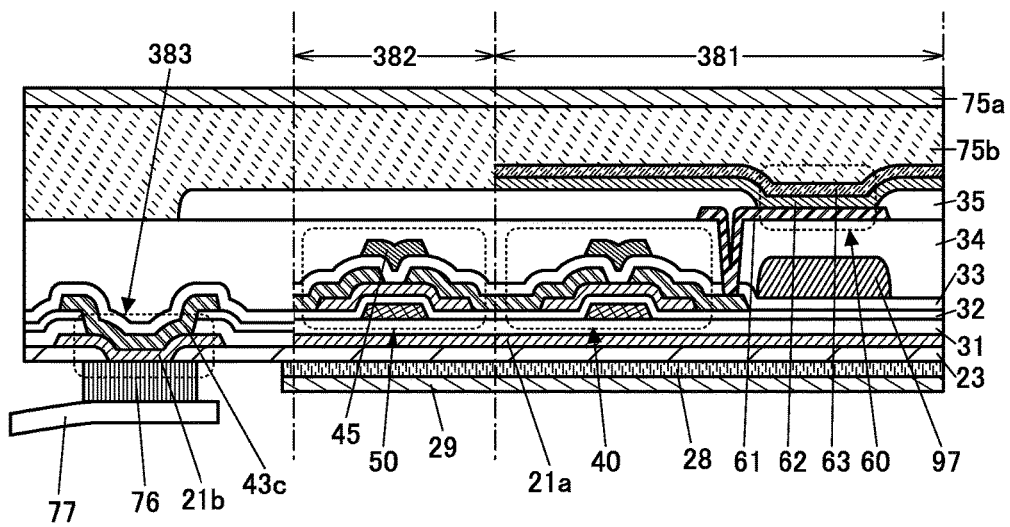
FIGS. 8A and 8B are cross-sectional views each illustrating an example of a display device.

FIG. 8A is a cross-sectional view including the display portion 381, the driver circuit portion 382, and the connection portion 383 of the display device.

The display device illustrated in FIG. 8A is a bottom-emission display device employing a color filter method.

The display device in FIG. 8A includes the substrate 29, the bonding layer 28, the resin layer 23, the conductive layer 21a, the conductive layer 21b, the insulating layer 31, the transistor 40, a transistor 50, the conductive layer 43c, the insulating layer 33, the insulating layer 34, the insulating layer 35, the display element 60, the coloring layer 97, the bonding layer 75b, and the substrate 75a.

FIG. 8A illustrates an example in which the transistor 40 and the transistor 50 each include a conductive layer 45 functioning as a gate, in addition to the components of the transistor 40 in FIG. 1C.

The display element 60 emits light to the coloring layer 97 side.

In the connection portion 383, the FPC 77 is electrically connected to the conductive layer 43c through the conductive layer 21b and the connector 76.

Modification Example 6

Figure 8B:
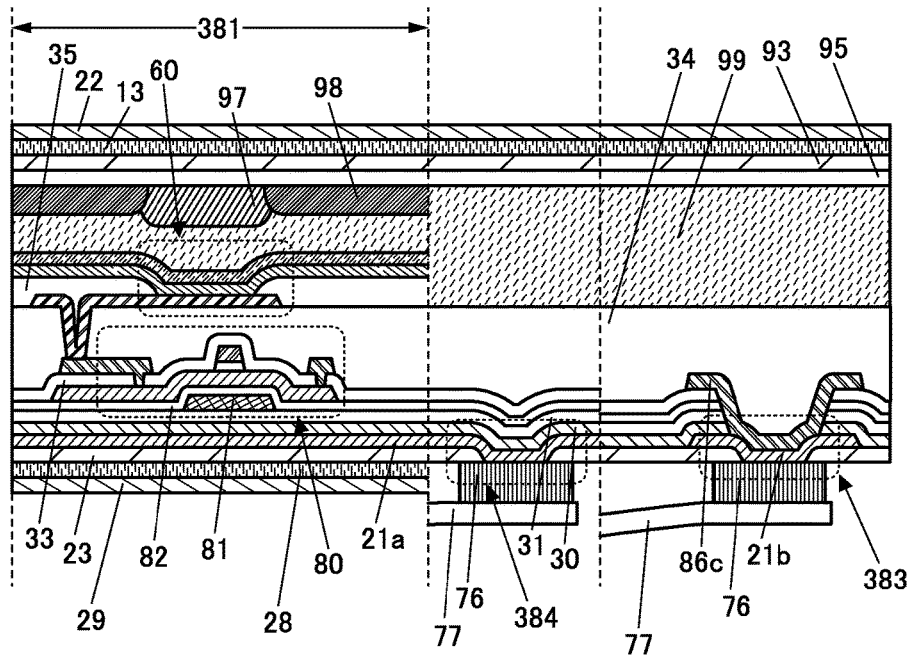

FIG. 8B is a cross-sectional view including the display portion 381, the connection portion 383, and the connection portion 384 of the display device.

FIG. 8B illustrates an example in which the transistor 80 includes a conductive layer 81 functioning as a gate and an insulating layer 82 functioning as a gate insulating layer, in addition to the components of the transistor 80 in FIG. 6B.

As described above, the display device of one embodiment of the present invention includes the conductive layer 21 (or the conductive layer 21a) which overlaps with the transistor and the display element and is electrically insulated from the transistor and the display element. A constant potential is supplied to the conductive layer 21 (or the conductive layer 21a). This makes it possible to reduce display defects of the display device which are caused by noise due to operation of other electronic components when the display device is incorporated in a housing of an electronic device. Thus, the display quality of the display device can be improved.

This embodiment can be combined with any other embodiment as appropriate.

Embodiment 2

In this embodiment, methods for manufacturing the display device of one embodiment of the present invention will be described.

In this embodiment, two methods for manufacturing the display device of one embodiment of the present invention will be mainly described.

In a first method, first of all, a first layer is formed using a photosensitive material over a formation substrate and then an opening is formed in the first layer by a photolithography method, so that a resin layer having an opening is formed. Next, an oxide conductive layer is formed over the formation substrate and the resin layer. A portion of the oxide conductive layer is provided over the resin layer, and the other portion of the oxide conductive layer is provided over and in contact with the formation substrate through the opening in the resin layer. Then, an insulating layer is formed over the oxide conductive layer. A transistor and the like are formed over the insulating layer. The resin layer and the oxide conductive layer are irradiated with light using a laser. After that, the transistor and the like are separated from the formation substrate.

In one embodiment of the present invention, the resin layer is formed using the photosensitive material. With the photosensitive material, a resin layer of a desired shape can be easily formed. For example, the opening can be easily provided in the resin layer.

However, in the case where separation is made to occur at the interface between the resin layer and the formation substrate or in the resin layer, the opening in the resin layer makes the separation of the formation substrate difficult in some cases.

Therefore, in one embodiment of the present invention, the oxide conductive layer is provided over and in contact with the formation substrate through the opening in the resin layer. Then, the resin layer and the oxide conductive layer are irradiated with light using a laser.

The resin layer is embrittled by laser light irradiation. Alternatively, the adhesion between the formation substrate and the resin layer is decreased by laser light irradiation.

A portion of the oxide conductive layer which overlaps with the opening in the resin layer is embrittled by laser light irradiation. Alternatively, the adhesion between the formation substrate and the portion of the oxide conductive layer which overlaps with the opening in the resin layer is decreased by laser light irradiation.

Thus, the formation substrate can be separated easily.

By the first method, the resin layer can be exposed in a portion where the resin layer is provided and the oxide conductive layer can be exposed through the opening in the resin layer.

In a second method, first of all, a resin layer is formed over a formation substrate. Next, a conductive layer is formed over the resin layer. Unlike in the first method, no opening is provided in the resin layer, and the conductive layer is not in contact with the formation substrate. Then, an insulating layer is formed over the conductive layer. A transistor and the like are formed over the insulating layer. The resin layer is irradiated with light using a laser. After that, the transistor and the like are separated from the formation substrate.

As described above, the resin layer is embrittled or the adhesion between the formation substrate and the resin layer is decreased by laser light irradiation.

In the second method, the separation can be achieved at the interface between the formation substrate and the resin layer by laser light irradiation. There is no separation region at the interface between the formation substrate and the conductive layer; therefore, the conductive layer is not limited to an oxide conductive layer, and any of a variety of conductive materials can be used.

By using the second method, the resin layer is exposed at a surface from which the formation substrate has been separated. It is preferable to remove at least a portion of the resin layer in order to expose at least a portion of the conductive layer.

An oxide semiconductor is preferably used in a channel formation region of the transistor. With the use of an oxide semiconductor, the maximum process temperature can be lower than that in the case of using LTPS.

According to one embodiment of the present invention, the transistor and the like are formed at a temperature lower than or equal to the allowable temperature limit of the resin layer. For example, the transistor is preferably formed at a temperature lower than or equal to 350° C., or even lower than or equal to 300° C.

According to one embodiment of the present invention, irradiation with a linear laser beam is performed. A laser apparatus used in a manufacturing line for LTPS or the like can be effectively used. Laser light is condensed into a long rectangular shape (and shaped into a linear laser beam), with which the resin layer (and the oxide conductive layer) is irradiated.

Hereinafter, the methods for manufacturing the display device of one embodiment of the present invention will be specifically described with reference to FIGS. 9A to 9E, FIGS. 10A to 10D, FIGS. 11A to 11C, FIGS. 12A, 12B1, and 12B2, FIGS. 13A to 13D, FIGS. 14A to 14C, FIGS. 15A to 15D, FIGS. 16A to 16C, FIGS. 17A to 17E, FIGS. 18A to 18C, FIGS. 19A and 19B, FIGS. 20A and 20B, and FIGS. 21A and 21B. Here, examples of manufacturing an active matrix organic EL display device will be described. With the use of a flexible material for a substrate, the display device can be a foldable organic EL display device.

Note that thin films included in the display device (e.g., insulating films, semiconductor films, and conductive films) can be formed by any of a sputtering method, a chemical vapor deposition (CVD) method, a vacuum evaporation method, a pulsed laser deposition (PLD) method, an atomic layer deposition (ALD) method, and the like. As the CVD method, a plasma-enhanced chemical vapor deposition (PECVD) method or a thermal CVD method may be used. As the thermal CVD method, for example, a metal organic chemical vapor deposition (MOCVD) method may be used.

Alternatively, thin films included in the display device (e.g., insulating films, semiconductor films, and conductive films) can be formed by a method such as spin coating, dipping, spray coating, ink-jetting, dispensing, screen printing, or offset printing, or with a doctor knife, a slit coater, a roll coater, a curtain coater, or a knife coater.

When thin films included in the display device are processed, a lithography method or the like can be used for the processing. Alternatively, island-shaped thin films may be formed by a film formation method using a shielding mask. Alternatively, a nanoimprinting method, a sandblasting method, a lift-off method, or the like may be used for the processing of thin films. Examples of the photolithography method include a method in which a resist mask is formed over a thin film to be processed, the thin film is processed by etching or the like, and the resist mask is removed, and a method in which a photosensitive thin film is formed and processed into a desired shape by light exposure and development.

In the case of using light in a lithography method, as light used for exposure, for example, light with an i-line (wavelength: 365 nm), light with a g-line (wavelength: 436 nm), light with an h-line (wavelength: 405 nm), or light in which the i-line, the g-line, and the h-line are mixed can be used. Alternatively, ultraviolet light, KrF laser light, ArF laser light, or the like can be used. Exposure may be performed by liquid immersion exposure technique. As the light for the exposure, extreme ultra-violet (EUV) light or X-rays may be used. Instead of the light for the exposure, an electron beam can be used. It is preferable to use EUV light, X-rays, or an electron beam because extremely minute processing can be performed. Note that in the case of performing exposure by scanning with a beam such as an electron beam, a photomask is not needed.

For etching of thin films, a dry etching method, a wet etching method, a sandblast method, or the like can be used.

Manufacturing Method Example 1

In this manufacturing method example 1, the case of manufacturing the display device illustrated in FIG. 1C is described.

Figure 9A:
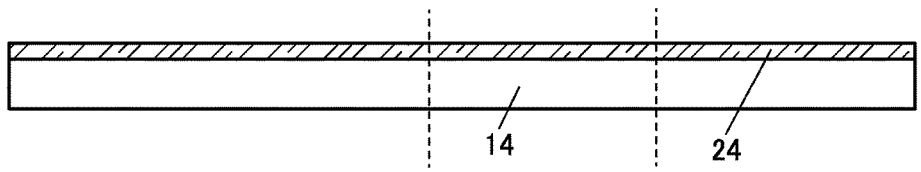
FIGS. 9A to 9E are cross-sectional views illustrating an example of a method for manufacturing a display device.

First, a first layer 24 is formed using a photosensitive material over a formation substrate 14 (FIG. 9A).

In particular, a photosensitive and thermosetting material is preferably used. In the example described in this embodiment, a photosensitive and thermosetting material is used.

In one embodiment of the present invention, since the photosensitive material is used, the resin layer 23 of a desired shape can be formed by removing a portion of the first layer 24 by a lithography method using light.

Figure 9B:
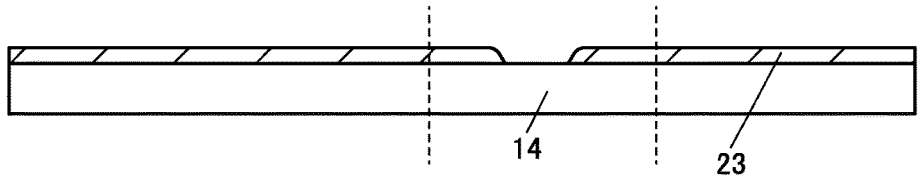

Specifically, heat treatment (also referred to as pre-baking treatment) for removing a solvent is performed after deposition of the material, and then light exposure is performed using a photomask. Next, development treatment is performed, so that an unnecessary portion can be removed. Next, the processed film of a desired shape is heated (this step is also referred to as post-baking treatment), so that the resin layer 23 is formed (FIG. 9B). FIG. 9B illustrates an example where an opening that reaches the formation substrate 14 is provided in the resin layer 23.

By the post-baking treatment, components to be outgassed (e.g., hydrogen or water) in the resin layer 23 can be reduced. It is particularly preferable that heating be performed at a temperature higher than or equal to the formation temperature of each layer to be formed over the resin layer 23. For example, in the case where the formation temperature of the transistor is below 350° C., a film to be the resin layer 23 is preferably heated at a temperature higher than or equal to 350° C. and lower than or equal to 450° C., further preferably higher than or equal to 350° C. and lower than or equal to 400° C., still further preferably higher than or equal to 350° C. and lower than or equal to 375° C. Thus, outgassing from the resin layer 23 in the manufacturing process of the transistor can be significantly reduced.

The resin layer 23 has flexibility. The formation substrate 14 has lower flexibility than the resin layer 23 does.

The resin layer 23 (or the first layer 24) is preferably formed using a photosensitive polyimide resin (also referred to as a PSPI).

Examples of photosensitive materials which can be used to form the resin layer 23 (or the first layer 24) include an acrylic resin, an epoxy resin, a polyamide resin, a polyimide-amide resin, a siloxane resin, a benzocyclobutene-based resin, and a phenol resin.

The resin layer 23 (or the first layer 24) is preferably formed with a spin coater. The spin coating method enables formation of a uniform thin film over a large substrate.

The resin layer 23 (or the first layer 24) is preferably formed using a solution with a viscosity of greater than or equal to 5 cP and less than 500 cP, further preferably greater than or equal to 5 cP and less than 100 cP, still further preferably greater than or equal to 10 cP and less than or equal to 50 cP. The lower the viscosity of the solution is, the easier the coating is. Furthermore, the lower the viscosity of the solution is, the more the entry of bubbles can be prevented, which leads to a film with good quality.

The resin layer 23 preferably has a thickness greater than or equal to 0.01 μm and less than 10 μm, further preferably greater than or equal to 0.1 μm and less than or equal to 3 μm, still further preferably greater than or equal to 0.5 μm and less than or equal to 1 μm. With a solution having low viscosity, the resin layer 23 having a small thickness can be easily formed. By forming the resin layer 23 thin, the display device can be manufactured at low cost. The display device can be lightweight and thin. The display device can have higher flexibility. The thickness of the resin layer 23 may be greater than or equal to 10 μm. For example, the resin layer 23 may have a thickness greater than or equal to 10 μm and less than or equal to 200 μm. The resin layer 23 having a thickness greater than or equal to 10 μm is favorable because the rigidity of the display device can be increased.

Alternatively, the resin layer 23 (or the first layer 24) can be formed by dipping, spray coating, ink-jetting, dispensing, screen printing, or offset printing, or with a doctor knife, a slit coater, a roll coater, a curtain coater, or a knife coater, for example.

The thermal expansion coefficient of the resin layer 23 is preferably greater than or equal to 0.1 ppm/° C. and less than or equal to 20 ppm/° C., further preferably greater than or equal to 0.1 ppm/° C. and less than or equal to 10 ppm/° C. The lower the thermal expansion coefficient of the resin layer 23 is, the more the breakage of the transistor or the like by heating can be prevented.

In the case where the resin layer 23 is positioned on the display surface side of the display device, the resin layer 23 preferably has a high visible-light transmitting property.

The formation substrate 14 has stiffness high enough for easy transfer and has resistance to heat applied in the manufacturing process. Examples of a material that can be used for the formation substrate 14 include glass, quartz, ceramics, sapphire, a resin, a semiconductor, a metal, and an alloy. Examples of the glass include alkali-free glass, barium borosilicate glass, and aluminoborosilicate glass.

Figure 9C:
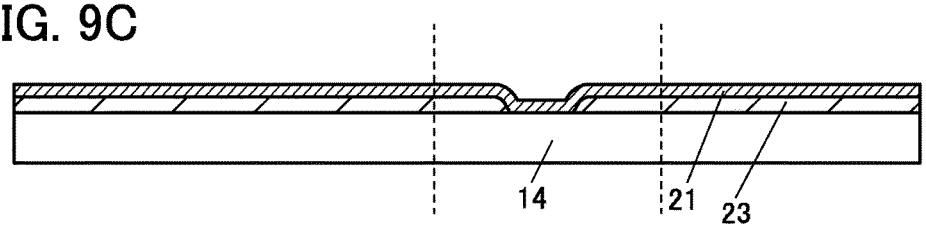

Next, the conductive layer 21 is formed over the formation substrate 14 and the resin layer 23 (FIG. 9C).

For the conductive layer 21, an oxide semiconductor that can be used for a semiconductor layer of a transistor, an oxide conductor (including an oxide semiconductor with increased defect states or impurity states) that can be used for a conductive layer of a transistor, or the like can be used, for example.

The conductive layer 21 preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, or the like may be contained. The conductive layer 21 preferably includes, for example, a film represented by an In-M-Zn-based oxide that contains at least indium, zinc, and M (aluminum, gallium, yttrium, tin, boron, silicon, titanium, iron, nickel, germanium, zirconium, molybdenum, lanthanum, cerium, neodymium, hafnium, tantalum, tungsten, or magnesium). It is particularly preferable to use an In-M-Zn-based oxide layer (M is Al, Ga, Y, or Sn) and further preferable to use an In—Ga—Zn-based oxide layer.

In this specification and the like, an In—Ga—Zn-based oxide means an oxide containing In, Ga, and Zn as its main components and there is no limitation on the ratio of In:Ga:Zn. The In—Ga—Zn-based oxide may contain another metal element in addition to In, Ga, and Zn.

In the case where the conductive layer 21 contains an In-M-Zn-based oxide, it is preferable that the atomic ratio of metal elements of a sputtering target used for forming a film of the In-M-Zn-based oxide be In:M:Zn=1:1:1, In:M:Zn=1:

1:1.2, In:M:Zn=1:3:2, InM:Zn=1:3:4, In:M:Zn=1:3:6, In:M: Zn=2:1:3, In:M:Zn=3:1:2, In:M:Zn=4:2:3, In:M:Zn=4:2: 4.1, In:M:Zn=5:1:6, In:M:Zn=5:1:7, InM:Zn=5:1:8, or the like. When a material with a high proportion of In is used, the energy gap of the conductive layer 21 can be made small and sufficient light can be absorbed by the conductive layer 21 in a later light irradiation step. In that case, the yield of separation can be increased. In addition, when the material with a high proportion of In is used, the conductivity of the conductive layer 21 can be increased. Note that the proportion of each metal element in the atomic ratio of the formed conductive layer 21 may vary within a range of ±40% of that in the above atomic ratio of the sputtering target.

Alternatively, an oxide conductive layer of an In-based oxide, an In—Sn-based oxide (ITO), an In—W-based oxide, an I—W—Zn-based oxide, an In—Ti-based oxide, an In—Ti—Sn-based oxide, an In—Zn-based oxide, a Zn-based oxide (ZnO), a Ga—Zn-based oxide, an In—Sn—Si-based oxide (ITSO), or the like may be used as the conductive layer 21.

The conductive layer 21 preferably has a function of releasing oxygen when the conductive layer 21 generates heat by absorbing light.

As the conductive layer 21, an oxide conductive layer and an oxide semiconductor layer from which oxygen is released by heating can be used, for example.

The oxide conductive layer and the oxide semiconductor layer can each be formed by a plasma CVD method, a sputtering method, or the like in an atmosphere containing oxygen, for example. Alternatively, oxygen ions may be implanted after deposition. In particular, in the case where the oxide semiconductor layer is used, a sputtering method in an atmosphere containing oxygen is preferred. After the formation of the conductive layer 21, heat treatment may be performed in an atmosphere containing oxygen in order that the conductive layer 21 contains a larger amount of oxygen.

An oxide semiconductor is a semiconductor material whose resistance can be controlled by oxygen vacancies in the film and/or the concentration of impurities (typified by hydrogen or water) in the film. Thus, the resistivity of the oxide semiconductor layer or the oxide conductive layer can be controlled by selecting treatment for increasing oxygen vacancies and/or impurity concentration on the oxide semiconductor layer or treatment for reducing oxygen vacancies and/or impurity concentration on the oxide semiconductor layer.

Specifically, the resistivity of the oxide semiconductor can be controlled by plasma treatment. For example, plasma treatment using a gas containing one or more kinds selected from a rare gas (He, Ne, Ar, Kr, or Xe), hydrogen, boron, phosphorus, and nitrogen can be employed. For example, plasma treatment can be performed in an Ar atmosphere, a mixed gas atmosphere of Ar and nitrogen, a mixed gas atmosphere of Ar and hydrogen, an ammonia atmosphere, a mixed gas atmosphere of Ar and ammonia, or a nitrogen atmosphere. Thus, the oxide semiconductor layer can have a high carrier density and a low resistivity.

Alternatively, hydrogen, boron, phosphorus, or nitrogen is implanted into the oxide semiconductor layer by an ion implantation method, an ion doping method, a plasma immersion ion implantation method, or the like, so that the resistivity of the oxide semiconductor layer can be reduced.

Alternatively, a method in which an insulating layer containing hydrogen and/or nitrogen is formed in contact with the oxide semiconductor layer and hydrogen and/or nitrogen are/is diffused from the insulating layer into the oxide semiconductor layer can be employed. Thus, the oxide semiconductor layer can have a high carrier density and a low resistivity.

For example, an insulating layer with a hydrogen concentration of greater than or equal to $1 \times 10^{22}$ atoms/cm$^3$ is formed in contact with the oxide semiconductor layer, in which case hydrogen can be effectively supplied to the oxide semiconductor layer. As the insulating layer, a silicon nitride film is preferably used.

Hydrogen included in the oxide semiconductor layer reacts with oxygen bonded to a metal atom to be water, and also causes oxygen vacancies in a lattice from which oxygen is released (or a portion from which oxygen is released). Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, the oxide semiconductor layer can have a high carrier density and a low resistivity.

In the case where heat treatment is performed in the manufacturing process of the display device, the oxide semiconductor layer may be heated and release oxygen, so that oxygen vacancies might be increased. Thus, the resistivity of the oxide semiconductor layer can be reduced.

Oxygen might be released from the oxide semiconductor layer and oxygen vacancies might be increased by laser irradiation of the oxide semiconductor layer in order to separate the oxide semiconductor layer from the formation substrate. Thus, the resistivity of the oxide semiconductor layer can be reduced.

Note that such an oxide conductive layer formed using an oxide semiconductor layer can be referred to as an oxide semiconductor layer having a high carrier density and a low resistivity, an oxide semiconductor layer having conductivity, or an oxide semiconductor layer having high conductivity.

For example, the thickness of the conductive layer 21 is preferably greater than or equal to 1 nm and less than or equal to 200 nm, further preferably greater than or equal to 5 nm and less than or equal to 100 nm.

After the conductive layer 21 is formed, plasma treatment or the like may be performed to reduce the resistivity of the conductive layer 21.

Note that by heat treatment in the following steps, oxygen and/or moisture are/is released from the conductive layer 21 and oxygen vacancies are caused, so that the resistivity of the conductive layer 21 is reduced in some cases.

The steps performed before laser light irradiation, which will be described later, are preferably performed at temperatures which are less likely to cause release of hydrogen from the conductive layer 21. Accordingly, a problem such as separation of the conductive layer 21 before laser light irradiation and a decrease in yield can be suppressed.

Forming the conductive layer 21 and the semiconductor layer of the transistor using the same metal element can reduce the manufacturing cost. For example, when metal oxide targets with the same metal composition are used, the manufacturing cost can be reduced and the same etching gas or the same etchant can be used in processing the oxide semiconductor layers. Even when the conductive layer 21 and the semiconductor layer of the transistor contain the same metal element, they have different compositions in some cases. For example, a metal element in a film is released during the manufacturing process of the display device, which might result in different metal compositions.

Figure 9D:
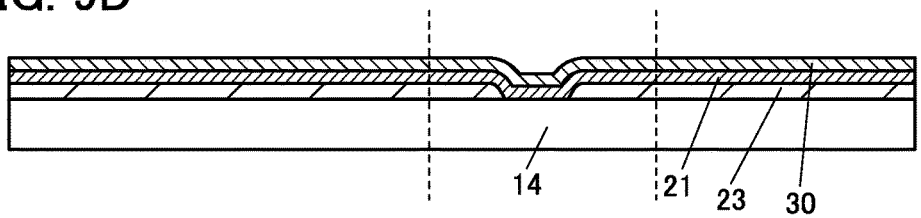

Next, the insulating layer 30 is formed over the conductive layer 21 (FIG. 9D).

The insulating layer 30 is formed at a temperature lower than or equal to the allowable temperature limit of the resin layer 23. The insulating layer 30 is preferably formed at a temperature lower than or equal to the heating temperature in the above-described post-baking treatment.

In the case where the oxide semiconductor layer is formed as the conductive layer 21, an insulating layer containing hydrogen and/or nitrogen is preferably used as the insulating layer 30. The carrier density of the conductive layer 21 can be increased and the resistivity thereof can be decreased by diffusion of hydrogen and/or nitrogen from the insulating layer 30 into the conductive layer 21.

For example, a silicon nitride film, a silicon nitride oxide film, or the like is preferably used as the insulating layer 30.

The insulating layer 30 is preferably formed at a temperature higher than or equal to room temperature (25° C.) and lower than or equal to 350° C., further preferably higher than or equal to 100° C. and lower than or equal to 300° C.

Note that the insulating layer 30 is not necessarily provided in some cases depending on the compositions or the like of the conductive layer 21 and the insulating layer 31. Examples of such cases include a case where the resistivity of the conductive layer 21 is sufficiently low, a case where the resistivity of the conductive layer 21 can be decreased by providing the insulating layer 31 and the conductive layer 21 in contact with each other, a case where treatment for decreasing the resistivity of the conductive layer 21 (such as plasma treatment) is performed, and the like.

Figure 9E:
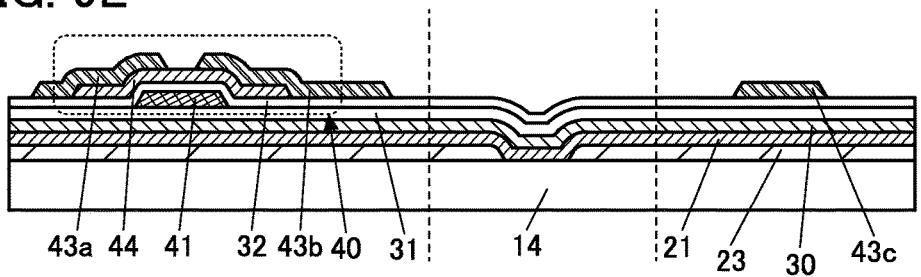

Next, the insulating layer 31 is formed over the insulating layer 30, and the transistor 40 is formed over the insulating layer 31 (FIG. 9E).

The insulating layer 31 can be used as a barrier layer that prevents diffusion of impurities contained in the resin layer 23 into the transistor and the display element formed later. For example, the insulating layer 31 preferably prevents moisture and the like contained in the resin layer 23 from diffusing into the transistor and the display element when the resin layer 23 is heated. Thus, the insulating layer 31 preferably has a high barrier property.

As the insulating layer 31, an inorganic insulating film such as a silicon nitride film, a silicon oxynitride film, a silicon oxide film, a silicon nitride oxide film, an aluminum oxide film, or an aluminum nitride oxide film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used.

It is particularly preferable that a silicon nitride film be formed as the insulating layer 30 over the conductive layer 21 and a silicon oxide film or a silicon oxynitride film be formed as the insulating layer 31 over the silicon nitride film.

An inorganic insulating film is preferably formed at high temperatures because the film can have a higher density and a higher barrier property as the deposition temperature becomes higher.

In the case of using an inorganic insulating film for the insulating layer 31, the substrate temperature during the film formation is preferably higher than or equal to room temperature and lower than or equal to 350° C., further preferably higher than or equal to 100° C. and lower than or equal to 300° C.

In the case where the resin layer 23 has an uneven surface, the insulating layer 31 preferably covers the unevenness. The insulating layer 31 may function as a planarization layer that fills the unevenness. It is preferable to use a stack including an organic insulating material and an inorganic insulating material for the insulating layer 31, for example. As the organic insulating material, the resin that can be used for the resin layer 23 can be used.

In the case of using an organic insulating film as the insulating layer 31, the temperature of heat applied to the resin layer 23 at the time of formation of the insulating layer 31 is preferably higher than or equal to room temperature and lower than or equal to 350° C., further preferably higher than or equal to room temperature and lower than or equal to 300° C.

In the manufacturing method example 1, the case where a bottom-gate transistor including the oxide semiconductor layer 44 is formed as the transistor 40 is described.

In one embodiment of the present invention, an oxide semiconductor is used as a semiconductor of the transistor. A semiconductor material having a wider bandgap and a lower carrier density than silicon is preferably used because an off-state current of the transistor can be reduced.

The transistor 40 is formed at a temperature lower than or equal to the allowable temperature limit of the resin layer 23. The transistor 40 is preferably formed at a temperature lower than or equal to the heating temperature in the above-described post-baking treatment.

Specifically, first, the conductive layer 41 is formed over the insulating layer 31 (FIG. 9E). The conductive layer 41 can be formed in the following manner: a conductive film is formed, a resist mask is formed, the conductive film is etched, and the resist mask is removed.

The substrate temperature during the formation of the conductive film is preferably higher than or equal to room temperature and lower than or equal to 350° C., further preferably higher than or equal to room temperature and lower than or equal to 300° C.

The conductive layers included in the display device can each have a single-layer structure or a stacked-layer structure including any of metals such as aluminum, titanium, chromium, nickel, copper, yttrium, zirconium, molybdenum, silver, tantalum, and tungsten or an alloy containing any of these metals as its main component. Alternatively, a light-transmitting conductive material such as an In-based oxide, ITO, an In—W-based oxide, an In—W—Zn-based oxide, an In—Ti-based oxide, an In—Ti—Sn-based oxide, an In—Zn-based oxide, ZnO, a Ga—Zn-based oxide, or ITSO may be used. Alternatively, a semiconductor such as an oxide semiconductor or polycrystalline silicon whose resistance is lowered by containing an impurity element, for example, or silicide such as nickel silicide may be used. A film including graphene may be used as well. The film including graphene can be formed, for example, by reducing a film containing graphene oxide. A semiconductor such as an oxide semiconductor containing an impurity element may be used. Alternatively, the conductive layers may be formed using a conductive paste of silver, carbon, copper, or the like or a conductive polymer such as a polythiophene. A conductive paste is preferable because it is inexpensive. A conductive polymer is preferable because it can be easily applied.

Next, the insulating layer 32 is formed (FIG. 9E). For the insulating layer 32, the description of the inorganic insulating film that can be used for the insulating layer 31 can be referred to.

Then, the oxide semiconductor layer 44 is formed (FIG. 9E). The oxide semiconductor layer 44 can be formed in the following manner: an oxide semiconductor film is formed, a resist mask is formed, the oxide semiconductor film is etched, and the resist mask is removed.

The substrate temperature during the formation of the oxide semiconductor film is preferably lower than or equal to 350° C., further preferably higher than or equal to room temperature and lower than or equal to 200° C., still further preferably higher than or equal to room temperature and lower than or equal to 130° C.

The oxide semiconductor film can be formed using one or both of an inert gas and an oxygen gas. Note that there is no particular limitation on the percentage of oxygen flow rate (partial pressure of oxygen) at the time of forming the oxide semiconductor film. To form a transistor having high field-effect mobility, however, the percentage of oxygen flow rate (partial pressure of oxygen) at the time of forming the oxide semiconductor film is preferably higher than or equal to 0% and lower than or equal to 30%, further preferably higher than or equal to 5% and lower than or equal to 30%, still further preferably higher than or equal to 7% and lower than or equal to 15%.

The oxide semiconductor film preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, or the like may be contained. The oxide semiconductor film preferably includes, for example, a film represented by an In-M-Zn-based oxide that contains at least indium, zinc, and M (aluminum, gallium, yttrium, tin, boron, silicon, titanium, iron, nickel, germanium, zirconium, molybdenum, lanthanum, cerium, neodymium, hafnium, tantalum, tungsten, or magnesium). It is particularly preferable to use an In-M-Zn-based oxide layer (M is Al, Ga, Y, or Sn) and further preferable to use an In—Ga—Zn-based oxide layer.

The semiconductor layer and the conductive layers may contain the same metal element selected from metal elements contained in the above oxides. The use of the same metal element for the semiconductor layer and the conductive layers can reduce the manufacturing cost. For example, when metal oxide targets with the same metal composition are used, the manufacturing cost can be reduced and the same etching gas or the same etchant can be used in processing the semiconductor layer and the conductive layers. Even when the semiconductor layer and the conductive layers contain the same metal element, they have different compositions in some cases. For example, a metal element in a film is released during the manufacturing process of the transistor and a capacitor, which might result in different metal compositions.

The energy gap of the oxide semiconductor is preferably 2 eV or more, further preferably 2.5 eV or more, still further preferably 3 eV or more. With the use of an oxide semiconductor having such a wide energy gap, the off-state current of the transistor can be reduced.

In the case where the oxide semiconductor contains an In-M-Zn-based oxide, it is preferable that the atomic ratio of metal elements of a sputtering target used for forming a film of the In-M-Zn-based oxide satisfy In≥M and Zn≥M. As the atomic ratio of metal elements of such a sputtering target, In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, In:M:Zn=5:1:8, or the like is preferable. Note that the proportion of each metal element in the atomic ratio of the formed semiconductor layer may vary within a range of ±40% of that in the above atomic ratio of the sputtering target.

The oxide semiconductor film can be formed by a sputtering method. Alternatively, a PLD method, a PECVD method, a thermal CVD method, an ALD method, a vacuum evaporation method, or the like may be used.

Next, the conductive layer 43a, the conductive layer 43b, and the conductive layer 43c are formed (FIG. 9E). The conductive layers 43a, 43b, and 43c can be formed in the following manner: a conductive film is formed, a resist mask is formed, the conductive film is etched, and the resist mask is removed. The conductive layers 43a and 43b are each connected to the oxide semiconductor layer 44.

Note that during the processing of the conductive layers 43a and 43b, the oxide semiconductor layer 44 might be partly etched to be thin in a region not covered by the resist mask.

The substrate temperature during the formation of the conductive film is preferably higher than or equal to room temperature and lower than or equal to 350° C., further preferably higher than or equal to room temperature and lower than or equal to 300° C.

In the above manner, the transistor 40 can be formed (FIG. 9E). In the transistor 40, part of the conductive layer 41 functions as a gate, part of the insulating layer 32 functions as a gate insulating layer, and the conductive layers 43a and 43b function as a source and a drain.

Figure 10A:
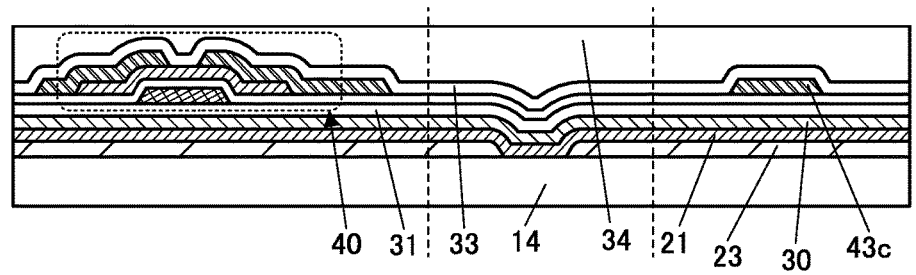
FIGS. 10A to 10D are cross-sectional views illustrating an example of a method for manufacturing a display device.

Next, the insulating layer 33 that covers the transistor 40 is formed (FIG. 10A). The insulating layer 33 can be formed in a manner similar to that of the insulating layer 31.

It is preferable that an oxide insulating film, such as a silicon oxide film or a silicon oxynitride film, formed at a low temperature in the above range in an atmosphere containing oxygen be used as the insulating layer 33. An insulating film with low oxygen diffusibility and oxygen permeability, such as a silicon nitride film, is preferably stacked over the silicon oxide film or the silicon oxynitride film. The oxide insulating film formed at low temperatures in an atmosphere containing oxygen can easily release a large amount of oxygen by heating. When a stack including such an oxide insulating film that releases oxygen and an insulating film with low oxygen diffusibility and oxygen permeability is heated, oxygen can be supplied to the oxide semiconductor layer 44. As a result, oxygen vacancies in the oxide semiconductor layer 44 can be filled and defects at the interface between the oxide semiconductor layer 44 and the insulating layer 33 can be repaired, leading to a reduction of defect states. Accordingly, an extremely highly reliable flexible device can be fabricated.

Through the above steps, the conductive layer 21, the insulating layer 30, the insulating layer 31, the transistor 40, and the insulating layer 33 can be formed over the resin layer 23 (FIG. 10A).

In the case where the formation substrate 14 and the transistor 40 are separated from each other at this stage by a method described later, a flexible device including no display element can be manufactured. Forming the transistor 40 or forming a capacitor, a resistor, a wiring, and the like in addition to the transistor 40, and separating the formation substrate 14 and the transistor 40 from each other by the method described later can provide a flexible device including a semiconductor circuit, for example.

Then, the insulating layer 34 is formed over the insulating layer 33 (FIG. 10A). The display element is formed on the insulating layer 34 in a later step; thus, the insulating layer 34 preferably functions as a planarization layer. For the insulating layer 34, the description of the organic insulating film or the inorganic insulating film that can be used for the insulating layer 31 can be referred to.

The insulating layer 34 is formed at a temperature lower than or equal to the allowable temperature limit of the resin layer 23. The insulating layer 34 is preferably formed at a temperature lower than or equal to the heating temperature in the above-described post-baking treatment.

In the case of using an organic insulating film as the insulating layer 34, the temperature of heat applied to the resin layer 23 at the time of formation of the insulating layer 34 is preferably higher than or equal to room temperature and lower than or equal to 350° C., further preferably higher than or equal to room temperature and lower than or equal to 300° C.

In the case of using an inorganic insulating film for the insulating layer 34, the substrate temperature during the film formation is preferably higher than or equal to room temperature and lower than or equal to 350° C., further preferably higher than or equal to 100° C. and lower than or equal to 300° C.

Next, openings that reach the conductive layer 43b, the conductive layer 43c, and the like are formed in the insulating layer 34 and the insulating layer 33.

Figure 10B:
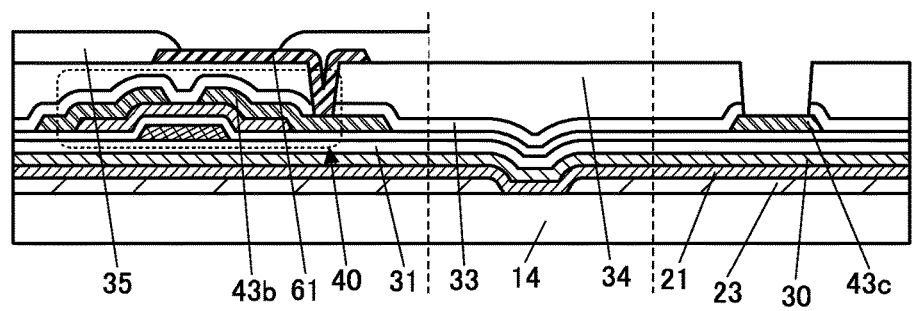

After that, the conductive layer 61 is formed (FIG. 10B). Part of the conductive layer 61 functions as the pixel electrode of the display element 60. The conductive layer 61 can be formed in the following manner: a conductive film is formed, a resist mask is formed, the conductive film is etched, and the resist mask is removed.

The conductive layer 61 is formed at a temperature lower than or equal to the allowable temperature limit of the resin layer 23. The conductive layer 61 is preferably formed at a temperature lower than or equal to the heating temperature in the above-described post-baking treatment.

The substrate temperature during the formation of the conductive film is preferably higher than or equal to room temperature and lower than or equal to 350° C., further preferably higher than or equal to room temperature and lower than or equal to 300° C.

Subsequently, the insulating layer 35 that covers an end portion of the conductive layer 61 is formed (FIG. 10B). For the insulating layer 35, the description of the organic insulating film or the inorganic insulating film that can be used for the insulating layer 31 can be referred to.

The insulating layer 35 is formed at a temperature lower than or equal to the allowable temperature limit of the resin layer 23. The insulating layer 35 is preferably formed at a temperature lower than or equal to the heating temperature in the above-described post-baking treatment.

In the case of using an organic insulating film for the insulating layer 35, the temperature of heat applied to the resin layer 23 at the time of formation of the insulating layer 35 is preferably higher than or equal to room temperature and lower than or equal to 350° C., further preferably higher than or equal to room temperature and lower than or equal to 300° C.

In the case of using an inorganic insulating film for the insulating layer 35, the substrate temperature during the film formation is preferably higher than or equal to room temperature and lower than or equal to 350° C., further preferably higher than or equal to 100° C. and lower than or equal to 300° C.

Figure 10C:
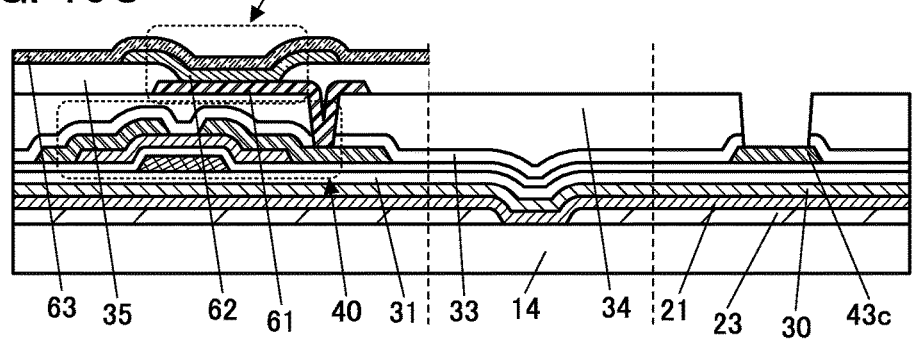

Then, the EL layer 62 and the conductive layer 63 are formed (FIG. 10C). Part of the conductive layer 63 functions as a common electrode of the display element 60.

The EL layer 62 can be formed by an evaporation method, a coating method, a printing method, a discharge method, or the like. In the case where the EL layer 62 is formed for each individual pixel, an evaporation method using a shielding mask such as a metal mask, an ink-jet method, or the like can be used. In the case where the EL layer 62 is shared by some pixels, an evaporation method not using a metal mask can be used.

Either a low molecular compound or a high molecular compound can be used for the EL layer 62, and an inorganic compound may also be included.

The conductive layer 63 can be formed by an evaporation method, a sputtering method, or the like.

The EL layer 62 and the conductive layer 63 are each formed at a temperature lower than or equal to the allowable temperature limit of the resin layer 23. The EL layer 62 and the conductive layer 63 are each preferably formed at a temperature lower than or equal to the heating temperature in the above-described post-baking treatment. The conductive layer 63 is formed at a temperature lower than or equal to the allowable temperature limit of the EL layer 62.

Specifically, the EL layer 62 and the conductive layer 63 are each preferably formed at a temperature higher than or equal to room temperature and lower than or equal to 350° C., further preferably higher than or equal to room temperature and lower than or equal to 300° C.

In the above manner, the display element 60 can be formed (FIG. 10C). In the display element 60, the conductive layer 61 part of which functions as a pixel electrode, the EL layer 62, and the conductive layer 63 part of which functions as a common electrode are stacked.

Although a top-emission light-emitting element is formed as the display element 60 here, one embodiment of the present invention is not limited thereto.

The light-emitting element may be a top-emission, bottom-emission, or dual-emission light-emitting element. A conductive film that transmits visible light is used as the electrode through which light is extracted. A conductive film that reflects visible light is preferably used as the electrode through which light is not extracted.

Figure 10D:
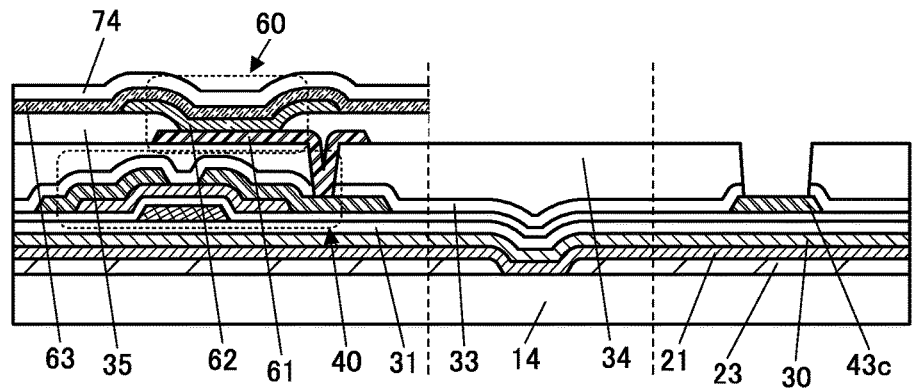

Next, the insulating layer 74 is formed so as to cover the conductive layer 63 (FIG. 10D). The insulating layer 74 functions as a protective layer that suppresses diffusion of impurities such as water into the display element 60. The display element 60 is sealed with the insulating layer 74.

The insulating layer 74 is formed at a temperature lower than or equal to the allowable temperature limit of the resin layer 23 and lower than or equal to the allowable temperature limit of the display element 60. The insulating layer 74 is preferably formed at a temperature lower than or equal to the heating temperature in the above-described post-baking treatment.

The insulating layer 74 preferably includes an inorganic insulating film with a high barrier property that can be used for the insulating layer 31. A stack including an inorganic insulating film and an organic insulating film can also be used.

Figure 11A:
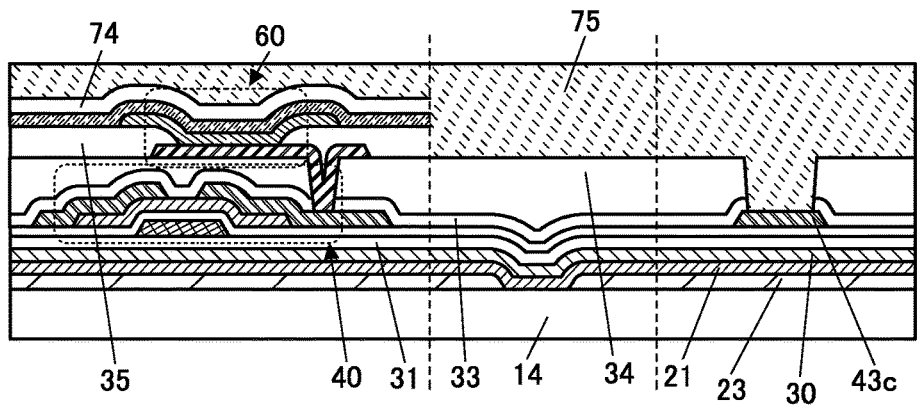
FIGS. 11A to 11C are cross-sectional views illustrating an example of a method for manufacturing a display device.

Then, the protective layer 75 is formed over the insulating layer 74 (FIG. 11A). The protective layer 75 can be used as a layer positioned as the outermost surface of the display device. The protective layer 75 preferably has a high visible-light transmitting property.

The above-described organic insulating film that can be used for the insulating layer 31 is preferably used for the protective layer 75 because the surface of the display device can be prevented from being damaged or cracked.

Figure 11B:
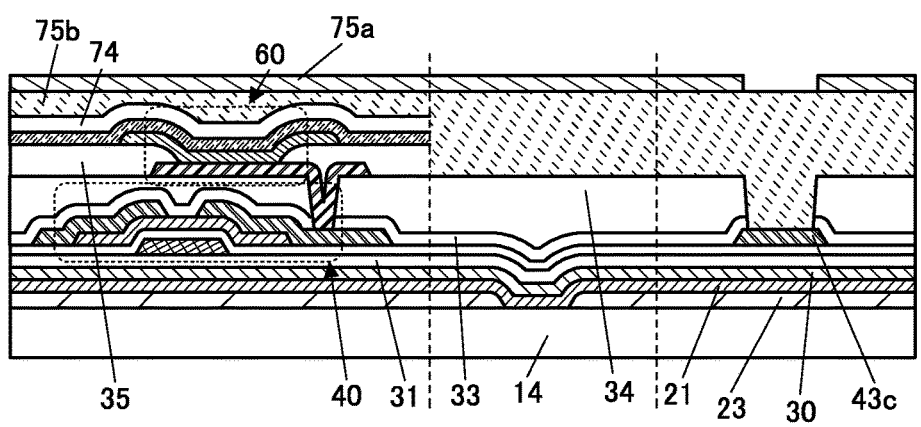
Figure 11C:
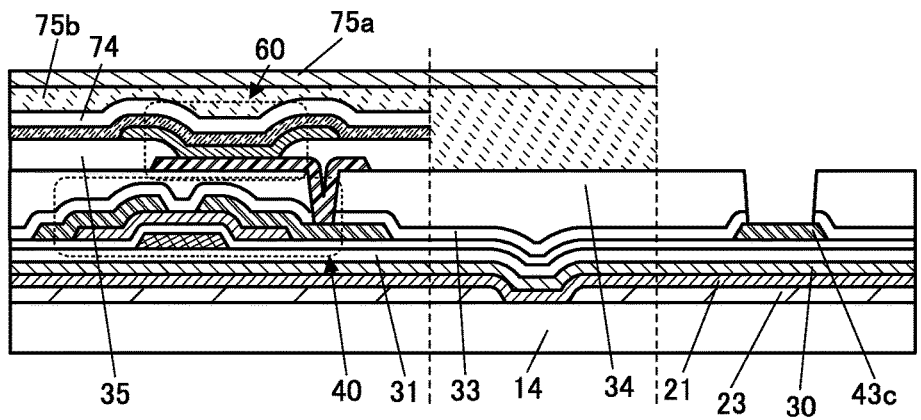

FIGS. 11B and 11C each illustrate an example in which the substrate 75a is attached to the insulating layer 74 with the bonding layer 75b.

In order to easily expose the conductive layer 43c in a later step or eliminate the step of exposing the conductive layer 43c, the protective layer 75, the substrate 75a, the bonding layer 75b, and the like are preferably positioned so as not to overlap with the conductive layer 43c. FIG. 11B illustrates an example in which the substrate 75a has an opening in a portion overlapping with the conductive layer 43c. FIG. 11C illustrates an example in which the substrate 75a and the bonding layer 75b do not overlap with the conductive layer 43c.

As the bonding layer 75b, any of a variety of curable adhesives, e.g., a reactive curable adhesive, a thermosetting adhesive, an anaerobic adhesive, and a photocurable adhesive such as an ultraviolet curable adhesive can be used. Alternatively, an adhesive sheet or the like may be used.

For the substrate 75a, a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyethersulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, or cellulose nanofiber can be used, for example. The substrate 75a formed using any of a variety of materials such as glass, quartz, a resin, a metal, an alloy, and a semiconductor may be thin enough to be flexible.

Next, the resin layer 23 and the conductive layer 21 are irradiated with laser light 65 through the formation substrate 14 (FIG. 12A). The laser light 65 is, for example, a linear laser beam with which scanning is performed from the left side to the right side in FIG. 12A, and the major axis is perpendicular to the scanning direction and the incident direction (from the bottom to the top).

The resin layer 23 and the conductive layer 21 (mainly a portion overlapping with the opening in the resin layer 23) absorbs the laser light 65.

The resin layer 23 is embrittled by irradiation with the laser light 65. Alternatively, the adhesion between the resin layer 23 and the formation substrate 14 is decreased by irradiation with the laser light 65.

The conductive layer 21 is embrittled by irradiation with the laser light 65. Alternatively, the adhesion between the conductive layer 21 and the formation substrate 14 is decreased by irradiation with the laser light 65.

By irradiation with the laser light 65, the conductive layer 21 is heated and oxygen is released from the conductive layer 21 in some cases. At this time, oxygen is released in a gaseous state, for example. The released gas remains near the interface between the conductive layer 21 and the formation substrate 14; thus, the force of separation occurs therebetween. Consequently, the adhesion between the conductive layer 21 and the formation substrate 14 is decreased to make a state where separation can be easily achieved.

Part of oxygen released from the conductive layer 21 remains in the conductive layer 21 in some cases. Thus, in some cases, the conductive layer 21 is embrittled and separation is likely to occur inside the conductive layer 21.

As the laser light 65, light having a wavelength at which at least part of the light is transmitted through the formation substrate 14 and absorbed by the resin layer 23 and the conductive layer 21 is selected. The laser light 65 is preferably light in a wavelength range from visible light to ultraviolet light. For example, light with a wavelength in a range of 200 nm to 400 nm, preferably a range of 250 nm to 350 nm can be used. In particular, an excimer laser with a wavelength of 308 nm is preferably used because the productivity is increased. The excimer laser is preferable because the excimer laser can be used also for laser crystallization of LTPS, so that existing LTPS production line apparatuses can be used and newly capital investment is not necessary. A solid-state UV laser (also referred to as a semiconductor UV laser), such as a UV laser with a wavelength of 355 nm that is the third harmonic of a Nd:YAG laser, may be used. A solid-state laser is preferable because the solid-state laser does not use a gas and thus the running cost can be reduced to approximately ⅓ of that in the case of an excimer laser. A pulsed laser such as a picosecond laser may be used.

In the case where linear laser light is used as the laser light 65, the formation substrate 14 and a light source are relatively moved to perform scanning with the laser light 65; thus, a region that is desirably separated is irradiated with the laser light 65.

Note that by irradiation of the conductive layer 21 with the laser light 65, oxygen and/or moisture are/is released from the conductive layer 21, oxygen vacancies are caused, so that the resistivity of the conductive layer 21 is reduced in some cases.

Next, the formation substrate 14 and the transistor 40 are separated from each other (FIG. 12B1 or 12B2).

The position of the separation surface may vary depending on materials and the formation methods of the conductive layer 21, the resin layer 23, the formation substrate 14, and the like, conditions of light irradiation, and the like.

FIG. 12B1 illustrates an example where separation occurs at the interface between the formation substrate 14 and the conductive layer 21 and the interface between the formation substrate 14 and the resin layer 23. By the separation, the resin layer 23 and the conductive layer 21 are exposed.

FIG. 12B2 illustrates an example where separation occurs in the resin layer 23 and the conductive layer 21. Part of the resin layer (a resin layer 23g) and part of the conductive layer (a conductive layer 21g) remain over the formation substrate 14. The thicknesses of the resin layer 23 and the conductive layer 21 remaining on the insulating layer 30 side are smaller than those in FIG. 12A.

The formation substrate 14 can be separated by applying pulling force in the perpendicular direction to the resin layer 23 and the conductive layer 21, for example. Specifically, the formation substrate 14 can be separated by pulling up the protective layer 75 by part of its suction-attached top surface.

A separation trigger is preferably formed by inserting a sharp instrument such as a knife between the formation substrate 14 and the resin layer 23.

In the separation step, static electricity may be generated by friction in the resin layer 23 because a mechanical force is applied to the formation substrate 14. The resin layer 23 has a highly insulating property. Therefore, in the case where the conductive layer 21 is not provided, local accumulation of a large amount of charge in a portion of the resin layer 23 which is directly below the transistor 40, for example, might break down the insulation between that portion and the transistor 40, resulting in damage to the transistor 40. This phenomenon is significant particularly in the case where the resin layer 23 is thin. In contrast, in one embodiment of the present invention, the conductive layer 21 exists between the transistor 40 and the resin layer 23; therefore, charge accumulated in the resin layer 23 diffuses through the conductive layer 21 and does not damage the transistor 40 directly. Thus, the conductive layer 21 has an effect of preventing charge from being locally accumulated in the resin layer 23 for some reason and preventing accumulated charge from damaging a circuit such as a transistor. Note that supplying a conductive liquid such as water to the separation surface in this step is also effective in preventing charge accumulation.

By separation of the formation substrate 14 and the transistor 40 from each other, the display device can be obtained. FIG. 1C illustrates the display device obtained in the case where separation occurs at the interface shown in FIG. 12B1.

As illustrated in FIG. 1C, the substrate 29 may be attached, with the bonding layer 28, to the surface of the resin layer 23 which is exposed by the separation. Note that the substrate 29 and the bonding layer 28 are positioned so as not to overlap with the exposed portion of the conductive layer 21. The substrate 29 can function as a supporting substrate of the flexible device.

The material that can be used for the substrate 75a can be used for the substrate 29.

The conductive layer 43c can be exposed by removal of a portion of the protective layer 75 which overlaps with the conductive layer 43c by laser light irradiation, cut processing, or the like. Then, the conductive layer 43c and the FPC 77 are electrically connected to each other through the connector 76. Accordingly, the conductive layer 43c can be electrically connected to the FPC 77.

Through the above steps, the display device using an oxide semiconductor for the transistor and a separate coloring method for the EL element can be manufactured (FIG. 1C).

Manufacturing Method Example 2

In this manufacturing method example 2, the case of manufacturing the display device illustrated in FIG. 1C is described. Unlike in the manufacturing method example 1, the case where the conductive layer 21 is not in contact with the formation substrate 14 is described in the manufacturing method example 2. Note that descriptions of portions similar to those in the manufacturing method example 1 might be omitted.

In the manufacturing method example 2, separation does not occur at the interface between the formation substrate 14 and the conductive layer 21; therefore, a material other than an oxide conductor or an oxide semiconductor can be used for the conductive layer 21. That is, the conductive layer 21 can be formed using any of a variety of conductive materials.

Figure 13A:
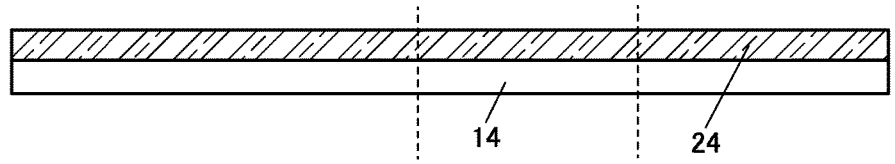
FIGS. 13A to 13D are cross-sectional views illustrating an example of a method for manufacturing a display device.
Figure 13B:
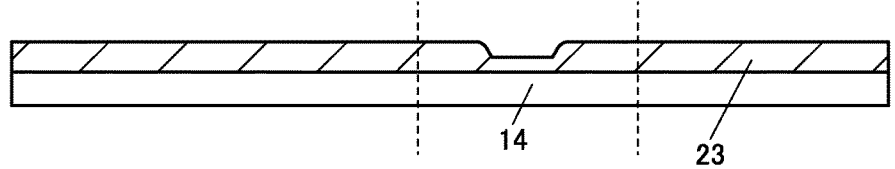

First, the first layer 24 is formed using a photosensitive material over the formation substrate 14 (FIG. 13A), and the resin layer 23 including a depressed portion is formed using the first layer 24 (FIG. 13B).

Specifically, pre-baking treatment is performed after deposition of the material, and then light exposure is performed using a photomask. Next, development treatment is performed, so that an unnecessary portion can be removed. Next, the processed film of a desired shape is heated (this step is also referred to as post-baking treatment), so that the resin layer 23 is formed. At the time of light exposure, the resin layer 23 including the depressed portion can be formed by setting the amount of light exposure smaller than the amount of light exposure for forming an opening in the resin layer 23. For example, the amount of light exposure can be reduced by performing light exposure for a shorter period of time, reducing the intensity of light, or shifting the focus of light, as compared with the light exposure conditions for forming an opening in the resin layer 23.

In order to form both the opening and the depressed portion in the resin layer 23, an exposure technique using a half-tone mask or a gray-tone mask or a multiple exposure technique using two or more photomasks is preferably used.

Figure 13C:
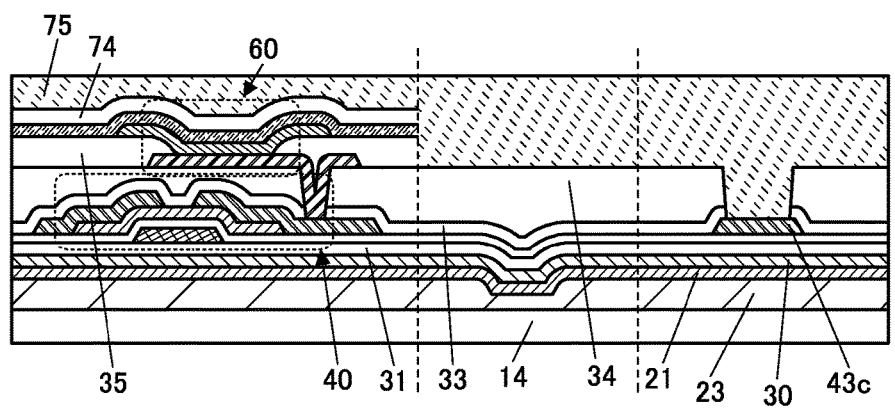

Next, in a manner similar to that in the manufacturing method example 1, components from the conductive layer 21 to the protective layer 75 are sequentially formed over the resin layer 23 (FIG. 13C).

For the conductive layer 21, any of a variety of conductive materials can be used in addition to the oxide semiconductor or the oxide conductor given as an example in the manufacturing method example 1. For example, a conductive material that can be used for transistor electrodes, wirings, and the like can be used. Specifically, the conductive layer 21 can have a single-layer structure or a stacked-layer structure including any of metals such as aluminum, titanium, chromium, nickel, copper, yttrium, zirconium, molybdenum, silver, tantalum, and tungsten or an alloy containing any of these metals as its main component. Alternatively, a semiconductor such as an oxide semiconductor or polycrystalline silicon whose resistance is lowered by containing an impurity element, for example, or silicide such as nickel silicide may be used. A film including graphene may be used as well. Alternatively, the conductive layer may be formed using a conductive paste of silver, carbon, copper, or the like or a conductive polymer such as a polythiophene.

Figure 13D:
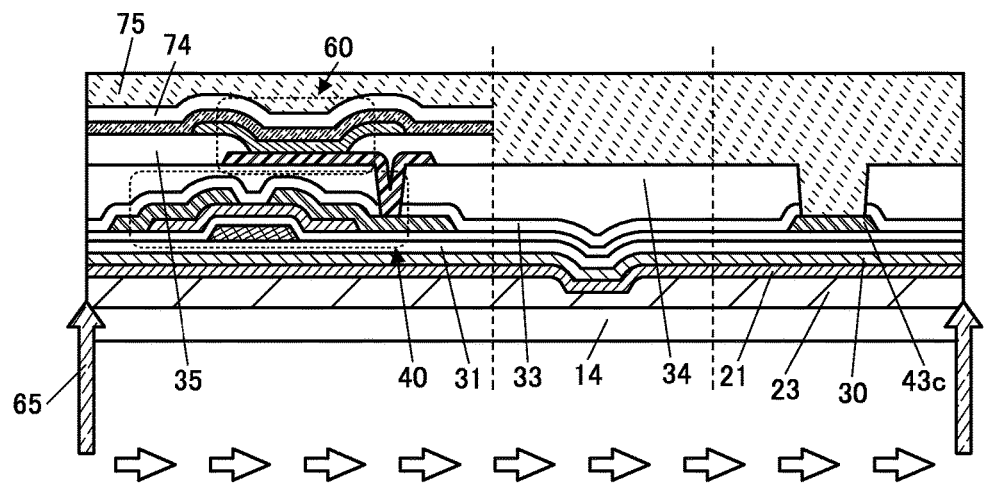

Next, the resin layer 23 is irradiated with the laser light 65 through the formation substrate 14 (FIG. 13D).

The resin layer 23 absorbs the laser light 65.

The resin layer 23 is embrittled by irradiation with the laser light 65. Alternatively, the adhesion between the resin layer 23 and the formation substrate 14 is decreased by irradiation with the laser light 65.

Figure 14A:
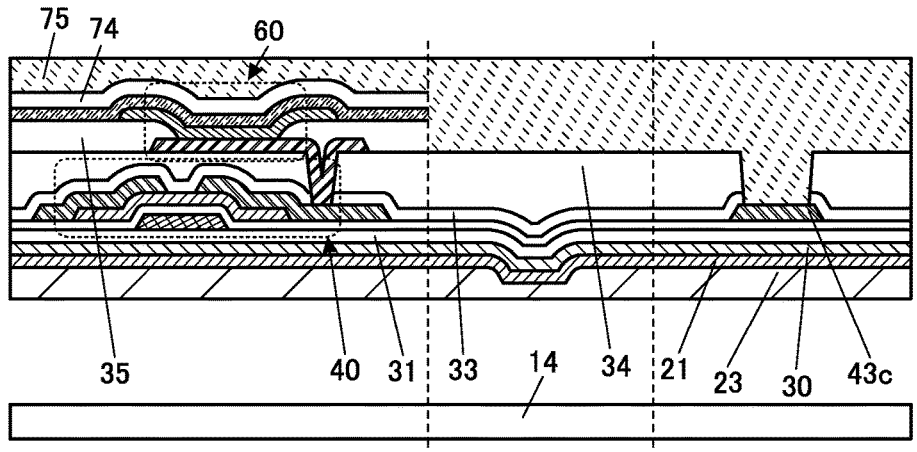
FIGS. 14A to 14C are cross-sectional views illustrating an example of a method for manufacturing a display device.
Figure 14B:
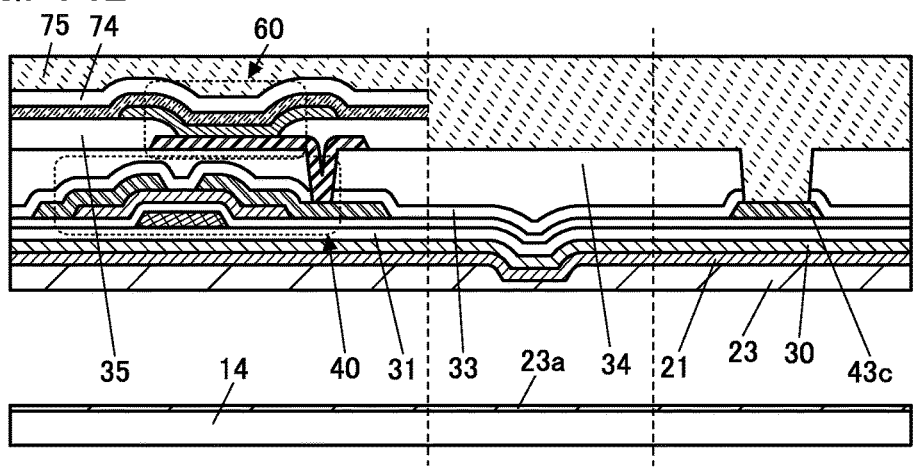
Figure 14C:
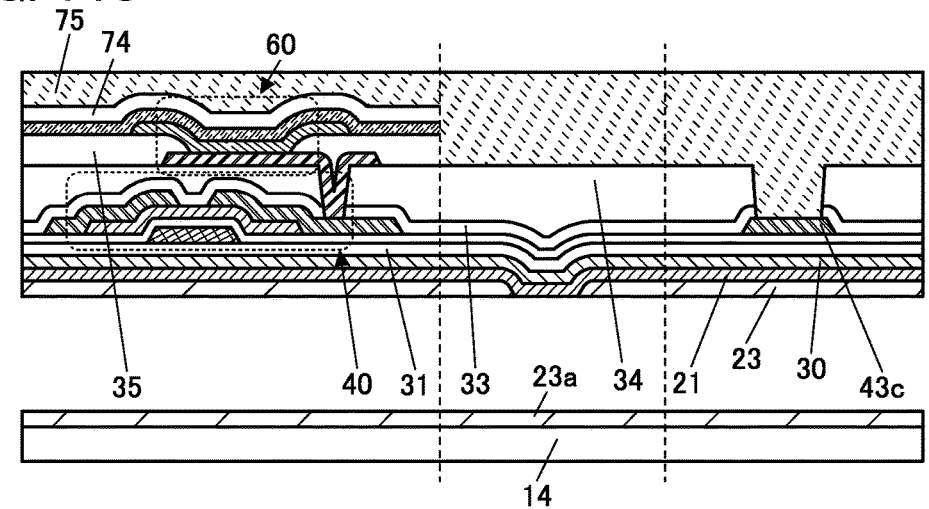

Next, the formation substrate 14 and the transistor 40 are separated from each other (FIG. 14A, 14B, or 14C).

FIG. 14A illustrates an example where separation occurs at the interface between the formation substrate 14 and the resin layer 23. By the separation, the resin layer 23 is exposed. The resin layer 23 does not remain on the formation substrate 14 side.

FIG. 14B illustrates an example where separation occurs in the resin layer 23. Part of the resin layer (a resin layer 23a) remains over the formation substrate 14. The thickness of the resin layer 23 remaining on the conductive layer 21 side is smaller than that in FIG. 13D.

FIG. 14C illustrates an example where separation occurs in the resin layer 23 and at the interface between the depressed portion of the resin layer 23 and the conductive layer 21. Part of the resin layer (the resin layer 23a) remains over the formation substrate 14. The thickness of the resin layer 23 remaining on the insulating layer 31 side is smaller than that in FIG. 13D.

In the case where the resin layer 23 remains and the conductive layer 21 is not exposed as illustrated in FIG. 14A or 14B, at least a portion of the remaining resin layer 23 is removed to expose the conductive layer 21. The resin layer 23 can be removed by, for example, plasma treatment in an atmosphere containing oxygen (this treatment is also referred to as ashing treatment).

After that, as in the manufacturing method example 1, the substrate 29 may be attached to the surface of the resin layer 23 with the bonding layer 28. In addition, the conductive layer 43c is exposed by removal of a portion of the protective layer 75 which overlaps with the conductive layer 43*c* by laser light irradiation, cut processing, or the like. Then, the conductive layer 43*c* and the FPC 77 are electrically connected to each other through the connector 76.

Through the above steps, the display device illustrated in FIG. 1C can be manufactured.

Manufacturing Method Example 3

In this manufacturing method example 3, the case of manufacturing the display device illustrated in FIG. 3B is described. As in the manufacturing method example 2, the case where the conductive layer 21 is not in contact with the formation substrate 14 is described in the manufacturing method example 3. Unlike in the manufacturing method examples 1 and 2, the case where the resin layer 23 is not provided with an opening or a depressed portion is described in the manufacturing method example 3. Note that descriptions of portions similar to those in the manufacturing method examples 1 and 2 might be omitted.

In the manufacturing method example 3, separation does not occur at the interface between the formation substrate 14 and the conductive layer 21; therefore, a material other than an oxide conductor or an oxide semiconductor can be used for the conductive layer 21. That is, the conductive layer 21 can be formed using any of a variety of conductive materials.

Figure 15A:
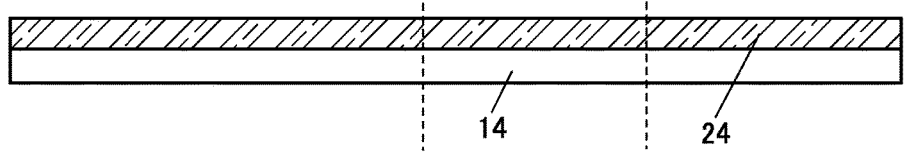
FIGS. 15A to 15D are cross-sectional views illustrating an example of a method for manufacturing a display device.
Figure 15B:
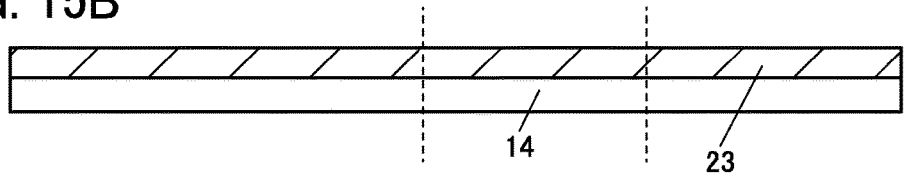

First, the first layer 24 is formed using a photosensitive material over the formation substrate 14 (FIG. 15A), and the resin layer 23 is formed by curing the first layer 24 (FIG. 15B).

Figure 15C:
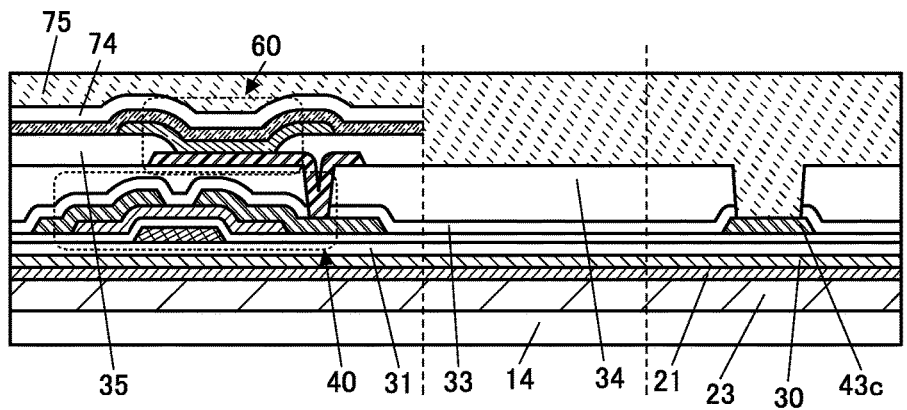

Next, in a manner similar to that in the manufacturing method example 1, components from the conductive layer 21 to the protective layer 75 are sequentially formed over the resin layer 23 (FIG. 15C).

For the conductive layer 21, the oxide semiconductor or the oxide conductor given as an example in the manufacturing method example 1 or the conductive material given as an example in the manufacturing method example 2 can be used.

Figure 15D:
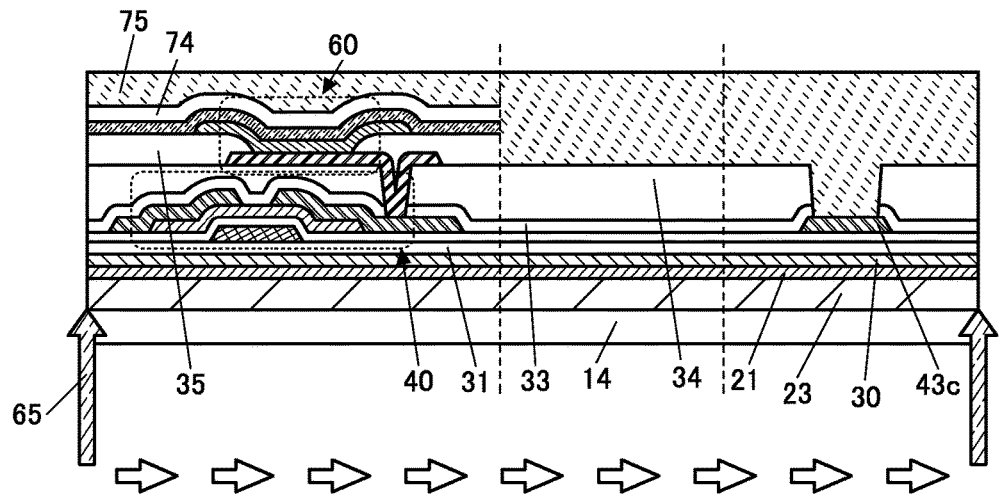

Next, the resin layer 23 is irradiated with the laser light 65 through the formation substrate 14 (FIG. 15D).

The resin layer 23 absorbs the laser light 65.

The resin layer 23 is embrittled by irradiation with the laser light 65. Alternatively, the adhesion between the resin layer 23 and the formation substrate 14 is decreased by irradiation with the laser light 65.

Figure 16A:
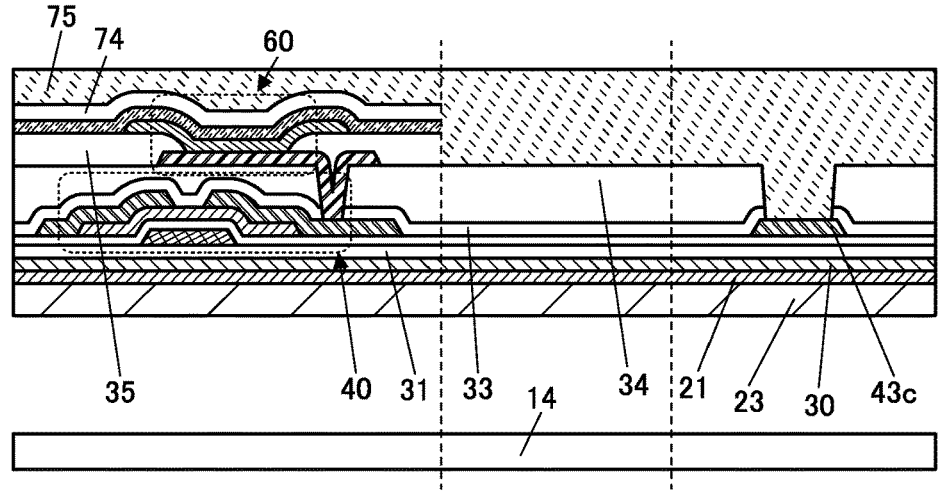
FIGS. 16A to 16C are cross-sectional views illustrating an example of a method for manufacturing a display device.

Next, the formation substrate 14 and the transistor 40 are separated from each other (FIG. 16A).

FIG. 16A illustrates an example where separation occurs at the interface between the formation substrate 14 and the resin layer 23. By the separation, the resin layer 23 is exposed. The resin layer 23 does not remain on the formation substrate 14 side.

Figure 16B:
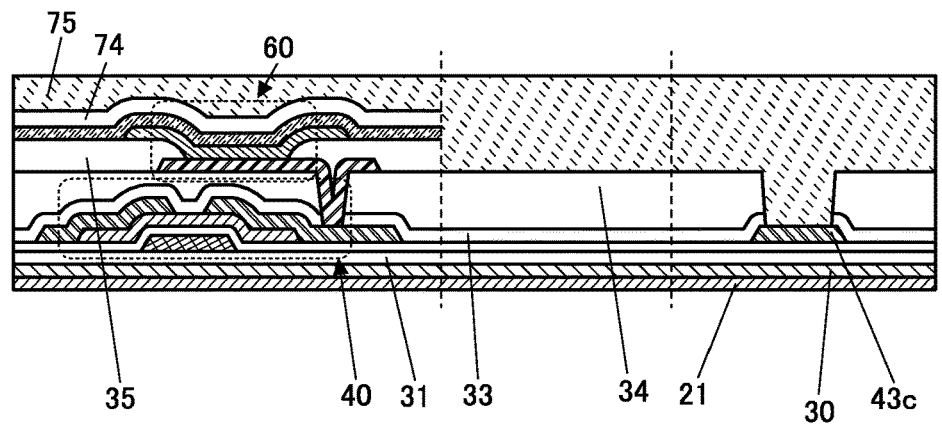

Next, the conductive layer 21 is exposed by removal of the resin layer 23 (FIG. 16B). The resin layer 23 can be removed by etching, for example.

Figure 16C:
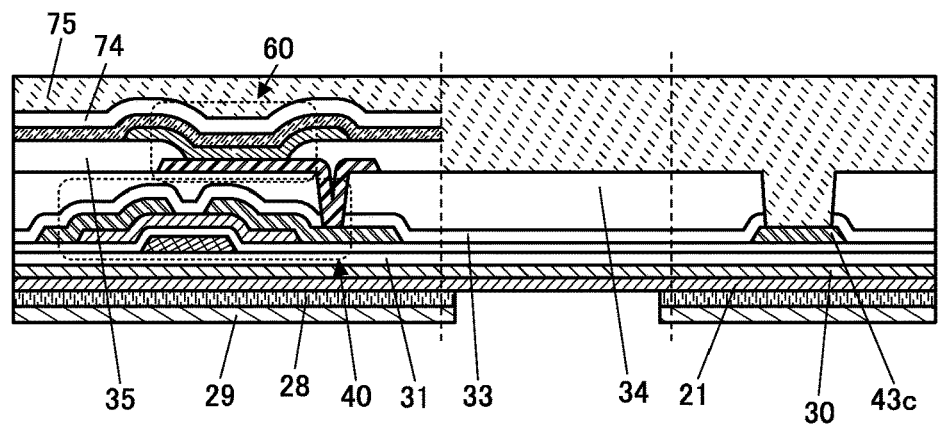

After that, the substrate 29 may be attached to the surface of the conductive layer 21 with the bonding layer 28 (FIG. 16C). Note that when at least a portion of the conductive layer 21 is exposed, the conductive layer 21 and the connection wiring 19 can be connected to each other later. Accordingly, a constant potential can be supplied to the conductive layer 21 from the connection wiring 19.

In addition, as in the manufacturing method example 1, the conductive layer 43*c* is exposed by removal of a portion of the protective layer 75 which overlaps with the conductive layer 43*c* by laser light irradiation, cut processing, or the like. Then, the conductive layer 43*c* and the FPC 77 are electrically connected to each other through the connector 76 (FIG. 3B).

Through the above steps, the display device illustrated in FIG. 3B can be manufactured.

Manufacturing Method Example 4

In this manufacturing method example 4, the case of manufacturing the display device illustrated in FIG. 6B is described. Note that descriptions of portions similar to those in the manufacturing method examples 1 to 3 might be omitted.

Figure 17A:
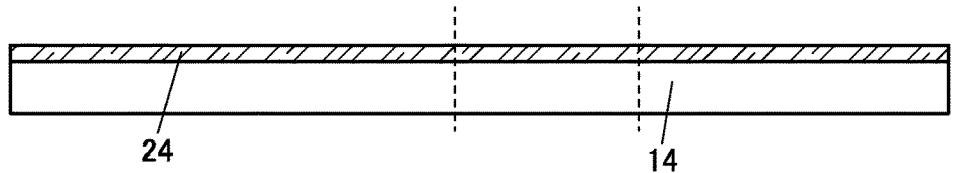
FIGS. 17A to 17E are cross-sectional views illustrating an example of a method for manufacturing a display device.
Figure 17B:
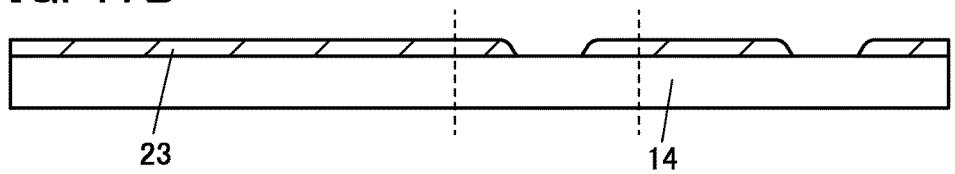

First, the first layer 24 is formed using a photosensitive material over the formation substrate 14 (FIG. 17A). Then, as in the manufacturing method example 1, the resin layer 23 having the opening reaching the formation substrate 14 is formed by a photolithography method (FIG. 17B).

Figure 17C:
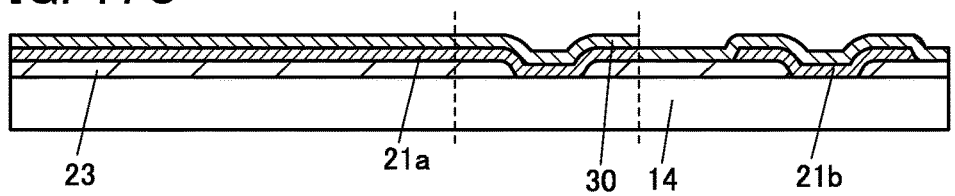

Next, the conductive layer 21*a* and the conductive layer 21*b* are formed over the formation substrate 14 and the resin layer 23 (FIG. 17C). The conductive layer 21*a* and the conductive layer 21*b* are electrically insulated from each other.

The conductive layer 21*a* and the conductive layer 21*b* can be formed using any of the materials that can be used for the conductive layer 21 and that are given as examples in the manufacturing method example 1.

The conductive layer 21*a* and the conductive layer 21*b* can be formed in the following manner: a conductive film is formed, a resist mask is formed, the conductive film is etched, and the resist mask is removed.

Next, the insulating layer 30 is formed over the resin layer 23, the conductive layer 21*a*, and the conductive layer 21*b* (FIG. 17C).

Figure 17D:
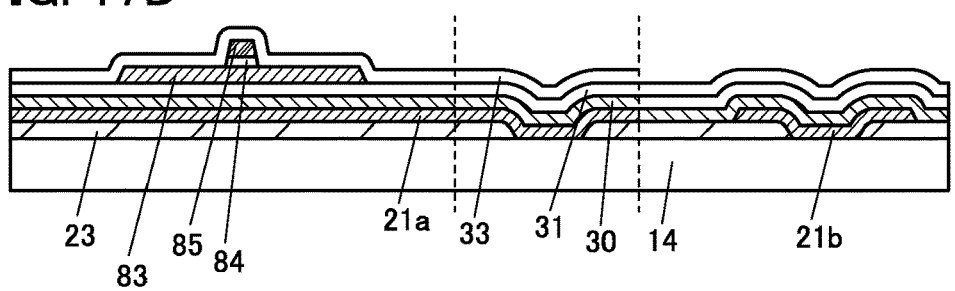
Figure 17E:
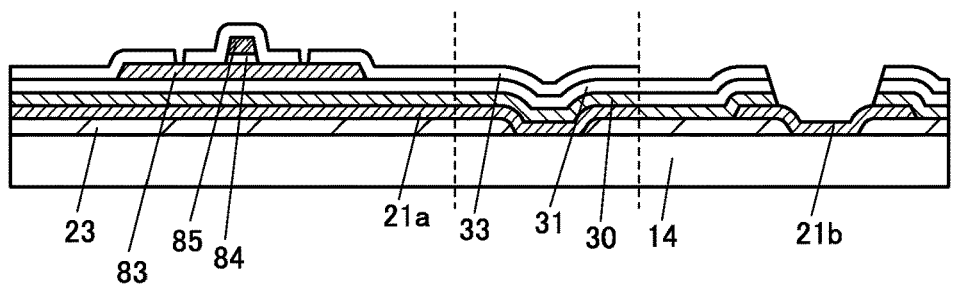
Figure 18A:
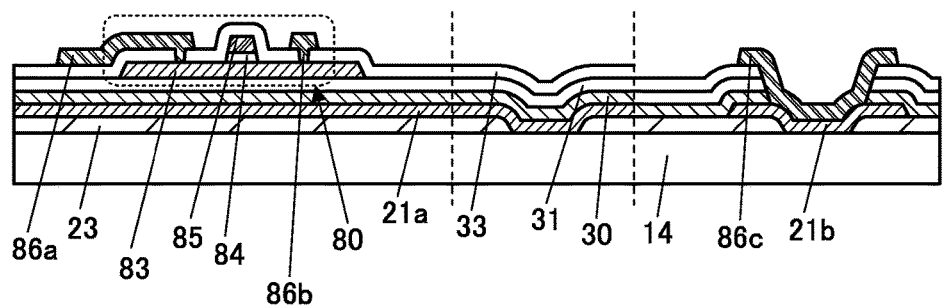
FIGS. 18A to 18C are cross-sectional views illustrating an example of a method for manufacturing a display device.

Next, the insulating layer 31 is formed over the insulating layer 30, and the transistor 80 is formed over the insulating layer 31 (FIGS. 17D, 17E, and 18A).

Here, the case where a transistor including the oxide semiconductor layer 83 and a top gate is formed as the transistor 80 is described.

The transistor 80 is formed at a temperature lower than or equal to the allowable temperature limit of the resin layer 23. The transistor 80 is preferably formed at a temperature lower than or equal to the heating temperature in the above-described post-baking treatment.

Specifically, first, the oxide semiconductor layer 83 is formed over the insulating layer 31 (FIG. 17D). The oxide semiconductor layer 83 can be formed in the following manner: an oxide semiconductor film is formed, a resist mask is formed, the oxide semiconductor film is etched, and the resist mask is removed. For the oxide semiconductor layer 83, the description of the material that can be used for the oxide semiconductor layer 44 can be referred to.

Next, the insulating layer 84 and the conductive layer 85 are formed (FIG. 17D). For the insulating layer 84, the description of the inorganic insulating film that can be used for the insulating layer 31 can be referred to. The insulating layer 84 and the conductive layer 85 can be formed in the following manner: an insulating film to be the insulating layer 84 and a conductive film to be the conductive layer 85 are formed, a resist mask is formed, the insulating film and the conductive film are etched, and the resist mask is removed.

Next, the insulating layer 33 that covers the oxide semiconductor layer 83, the insulating layer 84, and the conductive layer 85 is formed. The insulating layer 33 can be formed in a manner similar to that of the insulating layer 31.

The conductive layer 21b is exposed by providing an opening in the insulating layer 30, the insulating layer 31, and the insulating layer 33 (FIG. 17E). Here, an example where an opening is formed in the insulating layers 30, 31, and 33 in one step is illustrated. The opening in the insulating layers 30, 31, and 33 may be formed in different steps. Furthermore, the opening may be formed in two or more of the insulating layers at the same time. For example, the opening may be formed in the insulating layers 30 and 31 before the oxide semiconductor layer 83 is formed. For example, the opening reaching the conductive layer 21b may be formed in the same step as openings reaching the oxide semiconductor layer 83 are formed in the insulating layer 33.

Next, the conductive layer 86a, the conductive layer 86b, and the conductive layer 86c are formed (FIG. 18A). The conductive layer 86a, the conductive layer 86b, and the conductive layer 86c can be formed in the following manner: a conductive film is formed, a resist mask is formed, the conductive film is etched, and the resist mask is removed. The conductive layer 86a and the conductive layer 86b are electrically connected to the oxide semiconductor layer 83 through the openings in the insulating layer 33. The conductive layer 86c is connected to the conductive layer 21b through the opening provided in the insulating layers 30, 31, and 33.

In the above manner, the transistor 80 can be formed (FIG. 18A). In the transistor 80, part of the insulating layer 84 functions as a gate insulating layer, and part of the conductive layer 85 functions as a gate. The oxide semiconductor layer 83 includes a channel region and a low-resistance region. The channel region overlaps with the conductive layer 85 with the insulating layer 84 provided therebetween. The low-resistance region includes a portion connected to the conductive layer 86a and a portion connected to the conductive layer 86b.

Figure 18B:
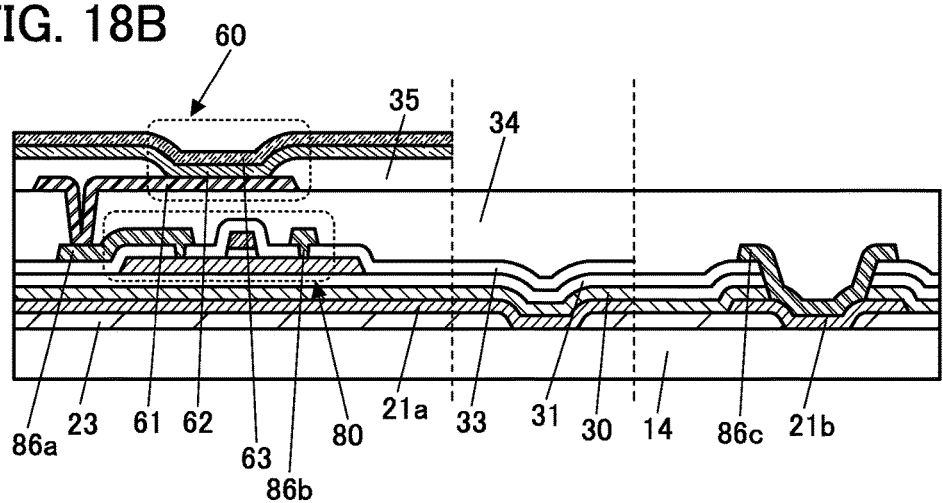

Next, components from the insulating layer 34 to the display element 60 are formed over the insulating layer 33 (FIG. 18B). For these steps, the manufacturing method example 1 can be referred to.

Figure 18C:
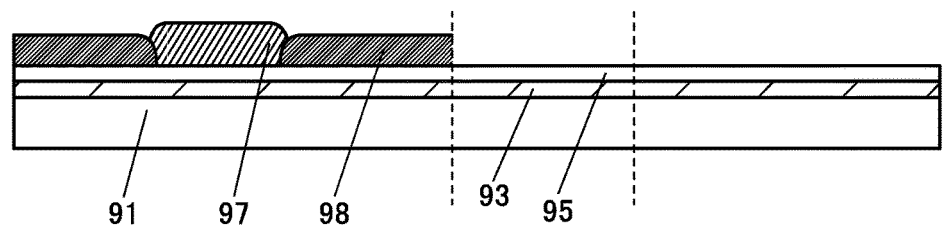

In addition, the resin layer 93 is formed using a photosensitive material over the formation substrate 91 (FIG. 18C).

The resin layer 93 has flexibility. The formation substrate 91 has lower flexibility than the resin layer 93 does. Since the resin layer 93 is formed over the formation substrate 91, the resin layer 93 can be transferred easily.

For the resin layer 93, a polyimide resin is preferably used. For the material and formation method of the resin layer 93, the description of the resin layer 23 can be referred to.

The resin layer 93 preferably has a thickness greater than or equal to 0.01 µm and less than 10 µm, further preferably greater than or equal to 0.1 µm and less than or equal to 3 µm, still further preferably greater than or equal to 0.5 µm and less than or equal to 1 µm. With a solution having low viscosity, the resin layer 93 having a small thickness can be easily formed. The thickness of the resin layer 93 may be greater than or equal to 10 µm.

In the case where the resin layer 93 is positioned on the display surface side of the display device, the resin layer 93 preferably has a high visible-light transmitting property.

For the formation substrate 91, the description of the formation substrate 14 can be referred to.

Next, the insulating layer 95 is formed over the resin layer 93. Then, the coloring layer 97 and the light-blocking layer 98 are formed over the insulating layer 95 (FIG. 18C).

For the insulating layer 95, the description of the insulating layer 31 can be referred to.

A color filter or the like can be used as the coloring layer 97. The coloring layer 97 is positioned so as to overlap with a display region of the display element 60.

A black matrix or the like can be used as the light-blocking layer 98. The light-blocking layer 98 is positioned so as to overlap with the insulating layer 35.

Figure 19A:
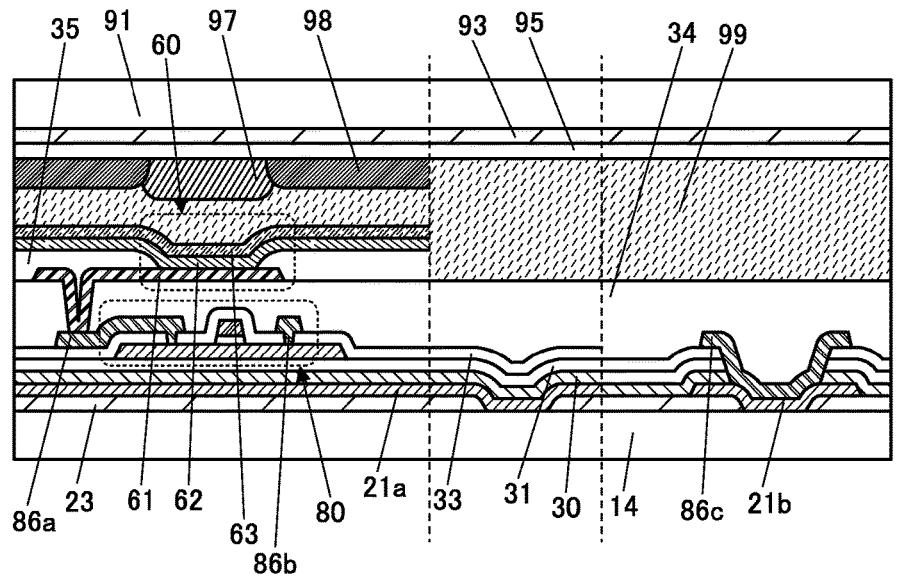
FIGS. 19A and 19B are cross-sectional views illustrating an example of a method for manufacturing a display device.

Next, a side of the formation substrate 14 on which the transistor 80 and the like are formed and a side of the formation substrate 91 on which the resin layer 93 and the like are formed are attached to each other with the bonding layer 99 (FIG. 19A).

Figure 19B:
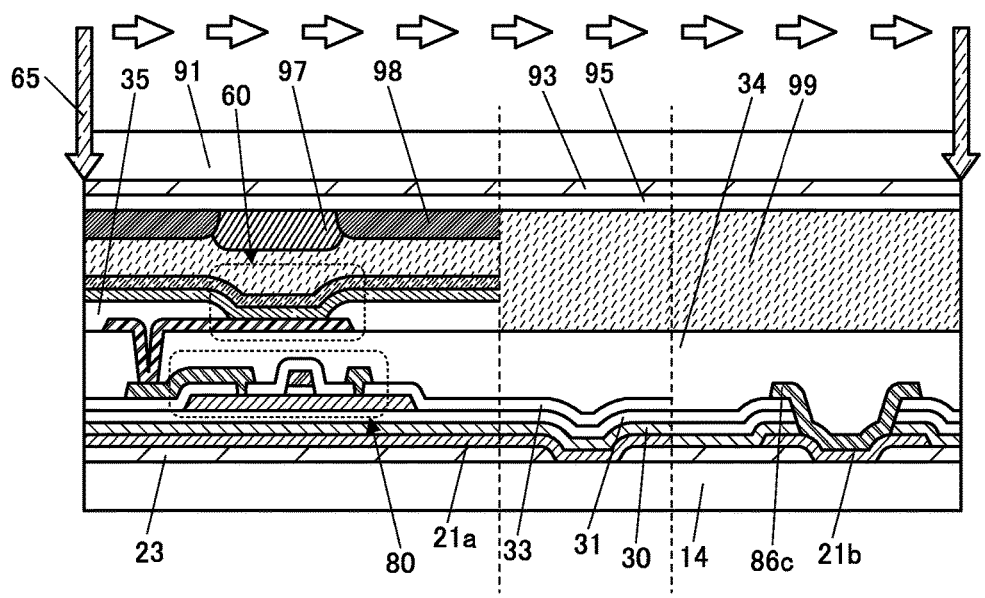

Next, the resin layer 93 is irradiated with the laser light 65 through the formation substrate 91 (FIG. 19B). Either the formation substrate 14 or the formation substrate 91 may be separated first. Here, an example in which the formation substrate 91 is separated ahead of the formation substrate 14 is shown.

The resin layer 93 is embrittled by irradiation with the laser light 65. Alternatively, the adhesion between the resin layer 93 and the formation substrate 91 is decreased by irradiation with the laser light 65.

Figure 20A:
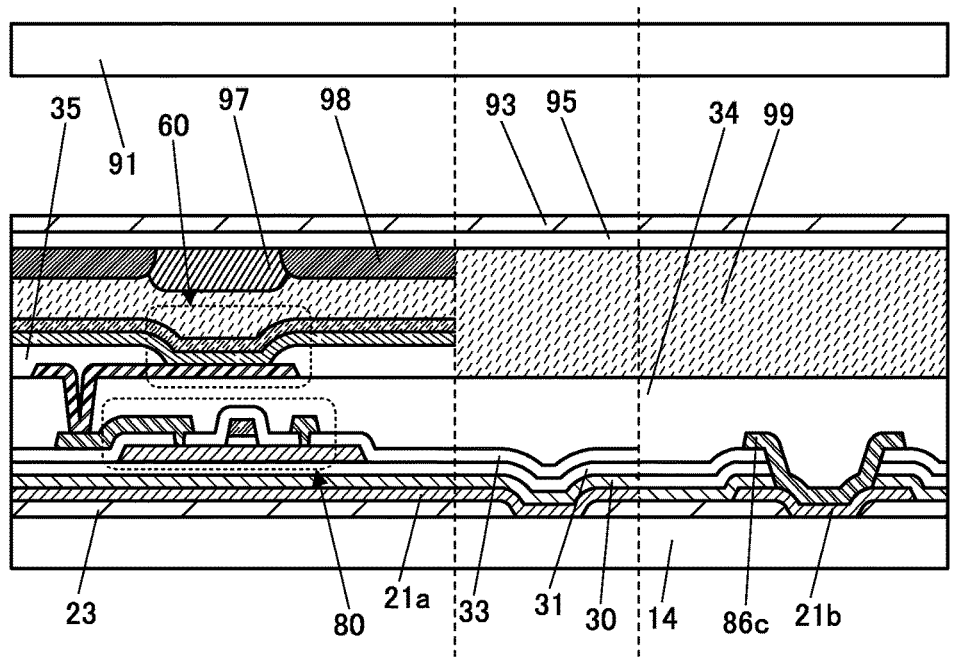
FIGS. 20A and 20B are cross-sectional views illustrating an example of a method for manufacturing a display device.

Next, the formation substrate 91 and the insulating layer 95 are separated from each other (FIG. 20A). FIG. 20A illustrates an example where separation occurs at the interface between the formation substrate 91 and the resin layer 93.

Note that separation may occur in the resin layer 93 in some cases. In such cases, part of the resin layer remains on the formation substrate 91 and thus the thickness of the resin layer 93 remaining on the insulating layer 95 side is smaller than that in FIG. 19B.

Figure 20B:
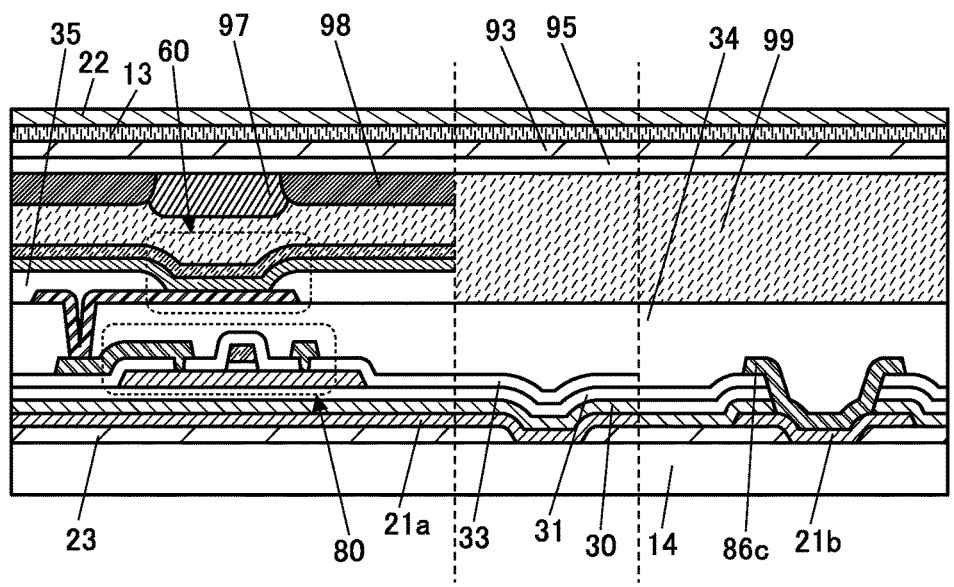

Then, the exposed resin layer 93 (or the insulating layer 95) and the substrate 22 are attached to each other with the bonding layer 13 (FIG. 20B).

In FIG. 20B, light emitted from the display element 60 is extracted to the outside of the display device through the coloring layer 97 and the resin layer 93. Thus, the resin layer 93 preferably has high visible-light transmittance. According to one embodiment of the present invention, the thickness of the resin layer 93 can be reduced. Therefore, the visible-light transmittance of the resin layer 93 can be increased.

The resin layer 93 may be removed, and the substrate 22 may be attached to the insulating layer 95 with the bonding layer 13.

The material that can be used for the bonding layer 75b can be used for the bonding layer 13.

The material that can be used for the substrate 75a can be used for the substrate 22.

Figure 21A:
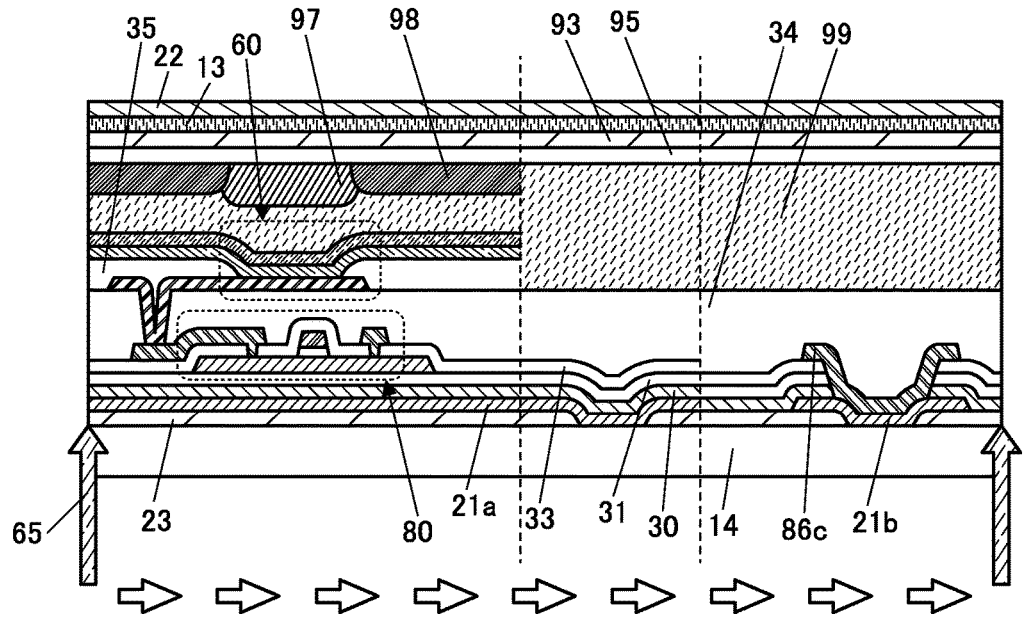
FIGS. 21A and 21B are cross-sectional views illustrating an example of a method for manufacturing a display device.

Next, the resin layer 23, the conductive layer 21a, and the conductive layer 21b are irradiated with the laser light 65 through the formation substrate 14 (FIG. 21A).

The resin layer 23 is embrittled by irradiation with the laser light 65. Alternatively, the adhesion between the resin layer 23 and the formation substrate 14 is decreased by irradiation with the laser light 65.

The conductive layer 21a and the conductive layer 21b are embrittled by irradiation with the laser light 65. Alternatively, the adhesion between the conductive layer 21a and the formation substrate 14 and the adhesion between the conductive layer 21b and the formation substrate 14 are decreased by irradiation with the laser light 65.

Figure 21B:
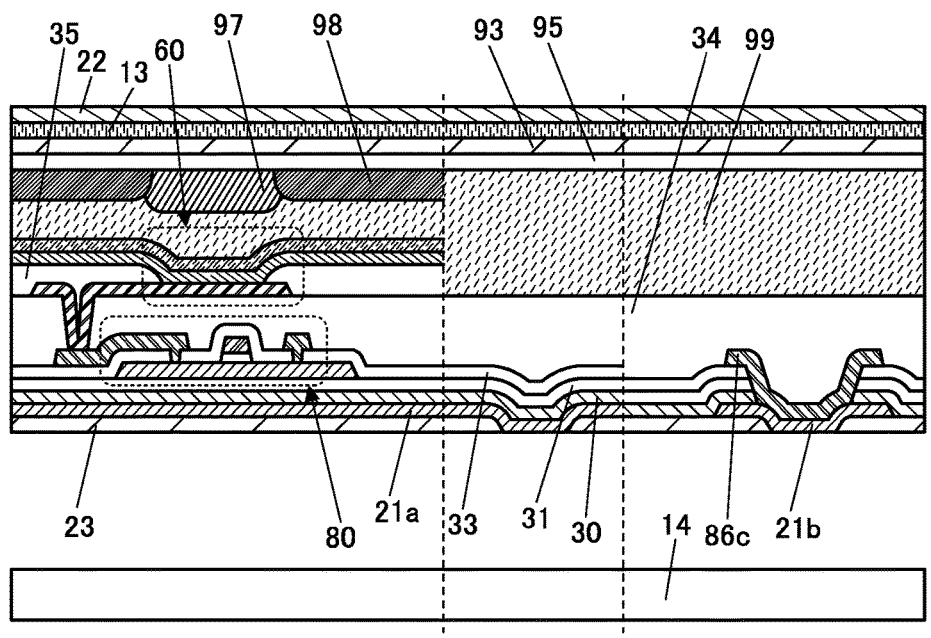

Next, the formation substrate 14 and the transistor 80 are separated from each other (FIG. 21B).

FIG. 21B illustrates an example where separation occurs at the interface between the formation substrate 14 and the conductive layer 21a, the interface between the formation substrate 14 and the conductive layer 21b, and the interface between the formation substrate 14 and the resin layer 23. By the separation, the resin layer 23, the conductive layer 21a, and the conductive layer 21b are exposed.

After that, as in the manufacturing method example 1, the substrate 29 may be attached to the surface of the resin layer 23 with the bonding layer 28 (FIG. 6B). The conductive layer 21a and the conductive layer 21b are electrically connected to connection wirings included in the FPC 77 through the connector 76. The conductive layer 21a and the conductive layer 21b are electrically connected to different connection wirings. Thus, the conductive layer 21a and the conductive layer 21b are electrically insulated from each other.

Through the above steps, the display device illustrated in FIG. 6B can be manufactured.

The manufacturing method example 4 is an example in which formation substrate separation is performed twice to manufacture a flexible device. In one embodiment of the present invention, each of the functional elements and the like included in the flexible device is formed over the formation substrate; thus, even in the case where a high-resolution display device is manufactured, high alignment accuracy of a flexible substrate is not required. It is thus easy to attach the flexible substrate.

This embodiment can be combined with any other embodiment as appropriate.

Embodiment 3

In this embodiment, a display module and electronic devices that can be manufactured using one embodiment of the present invention will be described with reference to FIG. 22 and FIGS. 23A to 23F.

Figure 22:
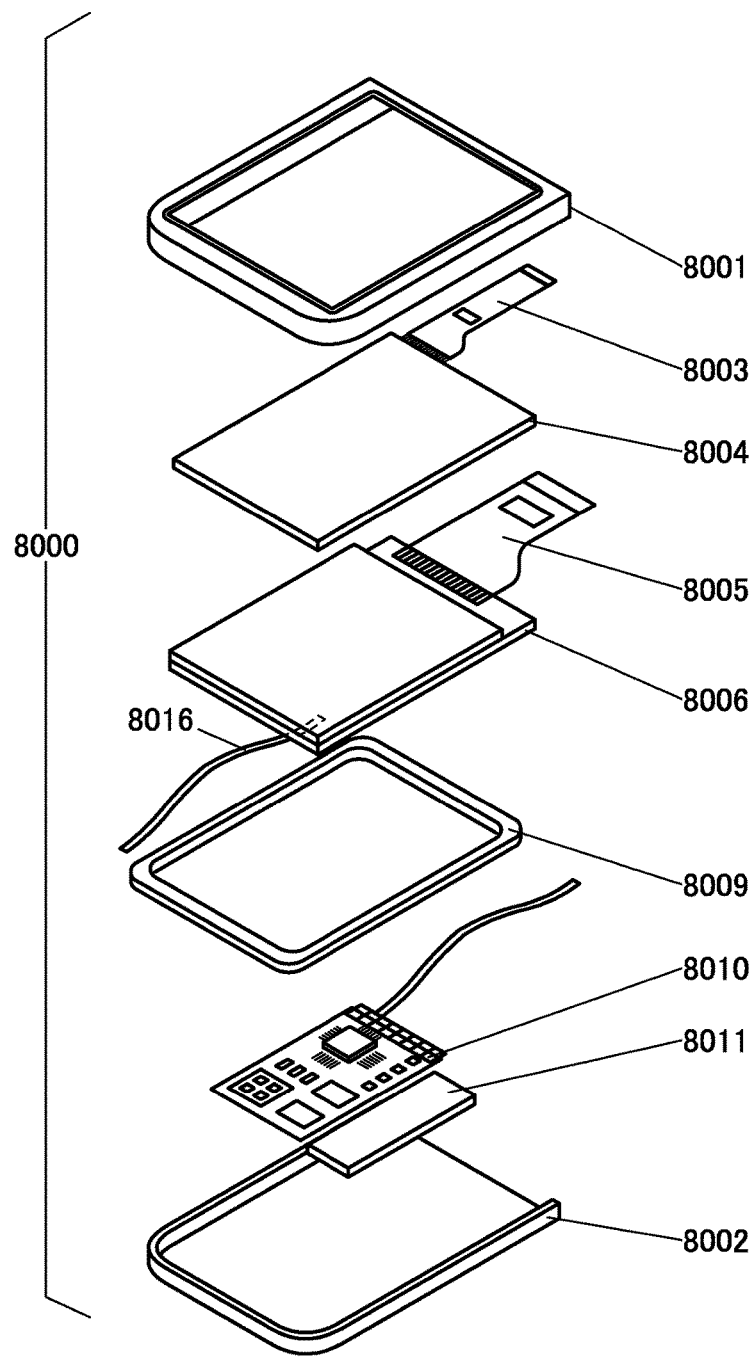
FIG. 22 illustrates an example of a display module.

In a display module 8000 in FIG. 22, a touch panel 8004 connected to an FPC 8003, a display panel 8006 connected to an FPC 8005, a frame 8009, a printed circuit board 8010, and a battery 8011 are provided between an upper cover 8001 and a lower cover 8002.

The display device of one embodiment of the present invention can be used for the display panel 8006, for example.

A connection wiring 8016 is connected to the display panel 8006. The connection wiring 8016 has a function of supplying a constant potential to a conductive layer included in the display panel 8006 (corresponding to the conductive layer 21 or the conductive layer 21a in Embodiment 1). The connection wiring 8016 is preferably connected to a GND line of the display module 8000. The connection wiring 8016 may be connected to the frame 8009.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and may be formed to overlap with the display panel 8006. Instead of providing the touch panel 8004, the display panel 8006 can have a touch panel function.

The frame 8009 has a function of protecting the display panel 8006. The frame 8009 may also serve as an electromagnetic shield for blocking electromagnetic waves generated by the operation of the printed circuit board 8010. The frame 8009 may serve as a radiator plate.

The printed circuit board 8010 has a power supply circuit and a signal processing circuit for outputting a video signal and a clock signal. As a power source for supplying power to the power supply circuit, an external commercial power source or the battery 8011 provided separately may be used. The battery 8011 can be omitted in the case of using a commercial power source.

The display module 8000 can additionally include a member such as a polarizing plate, a retardation plate, or a prism sheet.

Highly reliable electronic devices with curved surfaces can be manufactured according to one embodiment of the present invention. In addition, flexible and highly reliable electronic devices can be manufactured according to one embodiment of the present invention.

Examples of electronic devices include television devices, desktop or laptop personal computers, monitors for computers and the like, cameras such as digital cameras and digital video cameras, digital photo frames, cellular phones, portable game machines, portable information terminals, audio playback devices, large game machines such as pin-ball machines, and the like.

The electronic device of one embodiment of the present invention can be incorporated along a curved inside/outside wall surface of a house or a building or a curved interior/exterior surface of a car.

The electronic device of one embodiment of the present invention may include a secondary battery. It is preferable that the secondary battery be capable of being charged by contactless power transmission.

Examples of the secondary battery include a lithium ion secondary battery such as a lithium polymer battery using a gel electrolyte (lithium ion polymer battery), a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. When a signal is received by the antenna, the electronic device can display an image, data, or the like on a display portion. When the electronic device includes the antenna and a secondary battery, the antenna may be used for contactless power transmission.

The electronic device of one embodiment of the present invention may include a sensor (which includes a function of measuring force, displacement, position, speed, acceleration, angular velocity, rotational frequency, distance, light, liquid, magnetism, temperature, a chemical substance, a sound, time, hardness, electric field, current, voltage, electric power, radiation, flow rate, humidity, gradient, oscillation, smell, or infrared rays).

The electronic device of one embodiment of the present invention can have a variety of functions, for example, a function of displaying a variety of data (a still image, a moving image, a text image, and the like) on the display portion, a touch panel function, a function of displaying a calendar, date, time, and the like, a function of executing a variety of types of software (programs), a wireless communication function, a function of reading a program or data stored in a recording medium, and the like.

Furthermore, an electronic device including a plurality of display portions can have a function of displaying image data mainly on one display portion while displaying text data on another display portion, a function of displaying a three-dimensional image by displaying images on a plurality of display portions with a parallax taken into account, or the like. Furthermore, an electronic device including an image receiving portion can have a function of taking a still image or a moving image, a function of automatically or manually correcting a taken image, a function of storing a taken image in a recording medium (an external recording medium or a recording medium incorporated in the electronic device), a function of displaying a taken image on the display portion, or the like. Note that functions that can be provided for the electronic device of one embodiment of the present invention are not limited to those described above, and the electronic device can have a variety of functions.

Figure 23A:
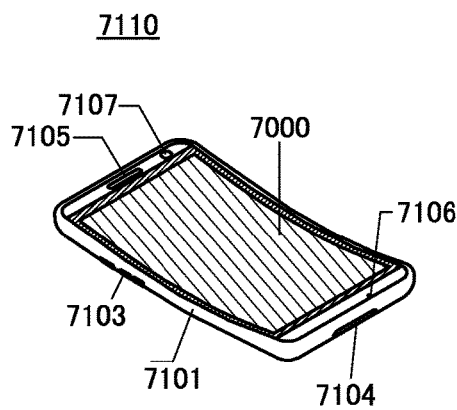
FIGS. 23A to 23F illustrate examples of electronic devices.
Figure 23B:
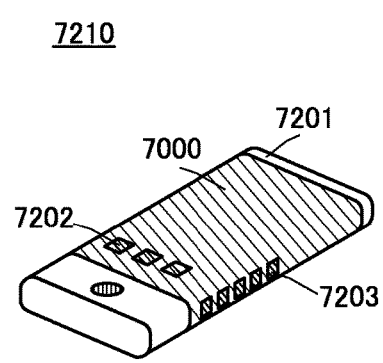
Figure 23C:
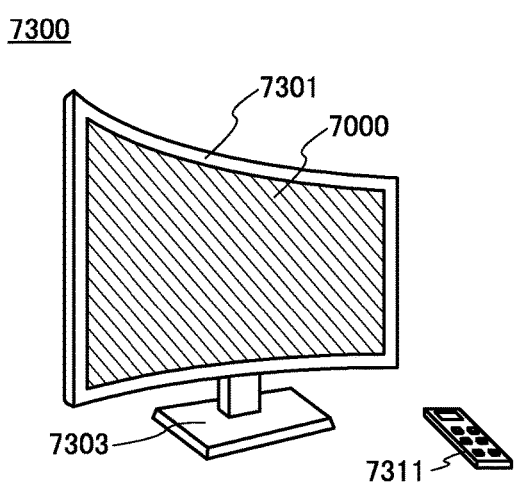

FIGS. 23A to 23C illustrate examples of electronic devices each including a display portion 7000 with a curved surface. The display surface of the display portion 7000 is curved, and images can be displayed on the curved display surface. Note that the display portion 7000 may be flexible.

The display portion 7000 is manufactured using the display device of one embodiment of the present invention. In accordance with one embodiment of the present invention, a highly reliable electronic device having a curved display portion can be provided.

FIG. 23A illustrates an example of a cellular phone. A cellular phone 7110 in FIG. 23A is provided with a housing 7101, the display portion 7000, operation buttons 7103, an external connection port 7104, a speaker 7105, a microphone 7106, a camera 7107, and the like.

The cellular phone 7110 includes a touch sensor in the display portion 7000. Operations such as making a call and inputting characters can be performed by touch on the display portion 7000 with a finger, a stylus, or the like.

The power can be turned on or off with the operation button 7103. In addition, types of images displayed on the display portion 7000 can be switched; for example, switching images from a mail creation screen to a main menu screen is performed with the operation button 7103.

When a detection device such as a gyroscope sensor or an acceleration sensor is provided inside the cellular phone, display on the screen of the display portion 7000 can be automatically changed by determining the orientation of the cellular phone (whether the cellular phone is placed horizontally or vertically for a landscape mode or a portrait mode). Furthermore, the orientation of display on the screen can be changed by touch on the display portion 7000, operation with the operation button 7103, sound input using the microphone 7106, or the like.

FIG. 23B illustrates an example of a portable information terminal. A portable information terminal 7210 in FIG. 23B includes a housing 7201 and the display portion 7000. The portable information terminal may also include an operation button, an external connection port, a speaker, a microphone, an antenna, a camera, a battery, or the like. The display portion 7000 is provided with a touch sensor. An operation of the portable information terminal can be performed by touching the display portion 7000 with a finger, a stylus, or the like.

The portable information terminal illustrated in this embodiment functions as, for example, one or more of a telephone set, a notebook, and an information browsing system. Specifically, the portable information terminal can be used as a smartphone. The portable information terminal illustrated in this embodiment is capable of executing a variety of applications such as mobile phone calls, e-mailing, reading and editing texts, music reproduction, Internet communication, and a computer game, for example.

The portable information terminal 7210 can display characters, image information, and the like on its plurality of surfaces. For example, three operation buttons 7202 can be displayed on one surface, and information 7203 indicated by rectangles can be displayed on another surface. FIG. 23B illustrates an example in which the operation buttons 7202 are displayed on the top surface of the portable information terminal 7210 and the information 7203 is displayed on the side surface of the portable information terminal 7210. Note that the operation buttons 7202 may be displayed on the side surface of the portable information terminal 7210 and the information 7203 may be displayed on the top surface of the portable information terminal 7210, for example. Information may also be displayed on three or more surfaces of the portable information terminal 7210.

Examples of the information 7203 include notification from a social networking service (SNS), display indicating reception of an e-mail or an incoming call, the subject of an e-mail or the like, the sender of an e-mail or the like, the date, the time, remaining battery level, and the reception strength of an antenna. Alternatively, the operation button, an icon, or the like may be displayed in place of the information 7203.

FIG. 23C illustrates an example of a television set. In a television set 7300, the display portion 7000 is incorporated in a housing 7301. Here, the housing 7301 is supported by a stand 7303.

The television set 7300 illustrated in FIG. 23C can be operated with an operation switch of the housing 7301 or a separate remote controller 7311. Alternatively, the display portion 7000 may include a touch sensor. The display portion 7000 can be operated by touching the display portion with a finger or the like. The remote controller 7311 may be provided with a display portion for displaying data output from the remote controller 7311. With operation keys or a touch panel of the remote controller 7311, channels and volume can be controlled and images displayed on the display portion 7000 can be controlled.

Note that the television set 7300 is provided with a receiver, a modem, or the like. A general television broadcast can be received with the receiver. Furthermore, when the television set is connected to a communication network with or without wires via the modem, one-way (from a transmitter to a receiver) or two-way (between a transmitter and a receiver or between receivers) data communication can be performed.

Figure 23D:
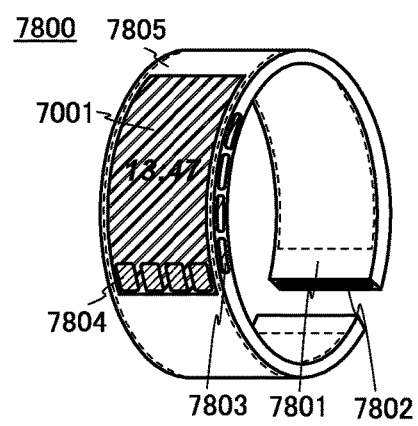
Figure 23E:
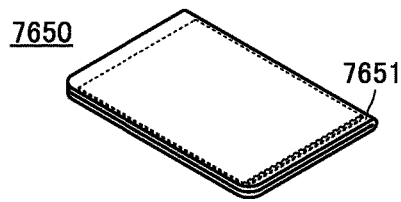
Figure 23F:
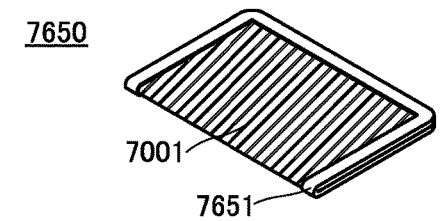

FIGS. 23D to 23F each illustrate an example of a portable information terminal including a flexible and bendable display portion 7001.

The display portion 7001 is manufactured using the display device or the like of one embodiment of the present invention. For example, a display device or the like that can be bent with a radius of curvature of greater than or equal to 0.01 mm and less than or equal to 150 mm can be used. The display portion 7001 may include a touch sensor so that the portable information terminal can be operated by touching the display portion 7001 with a finger or the like. In accordance with one embodiment of the present invention, a highly reliable electronic device having a flexible display portion can be provided.

FIG. 23D illustrates an example of a wristwatch-type portable information terminal. A portable information terminal 7800 includes a band 7801, the display portion 7001, an input/output terminal 7802, operation buttons 7803, or the like. The band 7801 has a function of a housing. A flexible battery 7805 can be mounted on the portable information terminal 7800. The battery 7805 may overlap with the display portion 7001, the band 7801, or the like, for example.

The band 7801, the display portion 7001, and the battery 7805 have flexibility. Thus, the portable information terminal 7800 can be easily curved to have a desired shape.

With the operation button 7803, a variety of functions such as time setting, on/off of the power, on/off of wireless communication, setting and cancellation of silent mode, and setting and cancellation of power saving mode can be performed. For example, the functions of the operation button 7803 can be set freely by the operating system incorporated in the portable information terminal 7800.

By touching an icon 7804 displayed on the display portion 7001 with a finger or the like, an application can be started.

The portable information terminal 7800 can employ near field communication that conforms to a communication standard. In that case, for example, mutual communication between the portable information terminal 7800 and a headset capable of wireless communication can be performed, and thus hands-free calling is possible.

The portable information terminal 7800 may include the input/output terminal 7802. In the case where the input/output terminal 7802 is included, data can be directly transmitted to and received from another information terminal via a connector. Charging through the input/output terminal 7802 is also possible. Note that charging of the portable information terminal described as an example in this embodiment can be performed by contactless power transmission without using the input/output terminal.

FIGS. 23E and 23F illustrate an example of a foldable portable information terminal. FIG. 23E illustrates a portable information terminal 7650 that is folded so that the display portion 7001 is on the inside. FIG. 23F illustrates the portable information terminal 7650 that is folded so that the display portion 7001 is on the outside. The portable information terminal 7650 includes the display portion 7001 and a non-display portion 7651. When the portable information terminal 7650 is not used, the portable information terminal 7650 is folded so that the display portion 7001 is on the inside, whereby the display portion 7001 can be prevented from being contaminated and damaged. Note that although FIGS. 23E and 23F illustrate an example of the portable information terminal 7650 that is folded in two, the portable information terminal 7650 may be folded in three, four, or more. The portable information terminal 7650 may also include an operation button, an external connection port, a speaker, a microphone, an antenna, a camera, a battery, or the like.

This embodiment can be combined with any other embodiment as appropriate.

This application is based on Japanese Patent Application serial no. 2016-095254 filed with Japan Patent Office on May 11, 2016, the entire contents of which are hereby incorporated by reference.

What is claimed is:

1. A display device comprising:
   a substrate;
   a first conductive layer over the substrate;
   a resin layer between the substrate and the first conductive layer; and
   a transistor and a light-emitting element over the first conductive layer,
   wherein the transistor and the light-emitting element are each electrically insulated from the first conductive layer,
   wherein the transistor and the light-emitting element each overlap with the substrate with the first conductive layer located therebetween, and
   wherein a constant potential is supplied to the first conductive layer.

2. The display device according to claim 1, wherein the resin layer has a thickness of more than or equal to 0.1 µm and less than or equal to 3 µm.

3. The display device according to claim 1, wherein the resin layer has a 5% weight-loss temperature of lower than 400° C.

4. The display device according to claim 1, wherein the resin layer has an opening, and wherein at least a portion of the first conductive layer is exposed through the opening in the resin layer.

5. The display device according to claim 4,
   wherein the substrate has an opening,
   wherein a portion of the opening in the substrate overlaps with the opening in the resin layer, and
   wherein at least a portion of the first conductive layer is exposed through the opening in the substrate.

6. The display device according to claim 1, further comprising an inorganic insulating layer over the first conductive layer,
   wherein the transistor and the light-emitting element are over the inorganic insulating layer.

7. The display device according to claim 1, wherein the transistor comprises an oxide semiconductor in a channel formation region.

8. The display device according to claim 1, wherein the substrate has flexibility.

9. The display device according to claim 1, wherein the first conductive layer comprises an oxide conductor.

10. A display device comprising:
    a substrate;
    a first resin layer over the substrate;
    a first conductive layer over the first resin layer;
    a second resin layer over the first conductive layer; and
    a transistor and a light-emitting element over the second resin layer,
    wherein the transistor and the light-emitting element are each electrically insulated from the first conductive layer,
    wherein the transistor and the light-emitting element each overlap with the substrate with the first conductive layer located therebetween,
    wherein the first conductive layer overlaps with the substrate with the first resin layer located therebetween, and
    wherein a constant potential is supplied to the first conductive layer.

11. The display device according to claim 10, further comprising a first inorganic insulating layer over the first conductive layer,
    wherein the second resin layer is over the first inorganic insulating layer.

12. The display device according to claim 11, further comprising a second inorganic insulating layer over the second resin layer,
    wherein the transistor and the light-emitting element are over the second inorganic insulating layer.

13. The display device according to claim 10, wherein the first resin layer has a thickness of more than or equal to 0.1 µm and less than or equal to 3 µm.

14. The display device according to claim 10, wherein the first resin layer has a 5% weight-loss temperature of lower than 400° C.

15. The display device according to claim 10,
wherein the first resin layer has an opening, and
wherein at least a portion of the first conductive layer is exposed through the opening in the first resin layer.

16. The display device according to claim 15,
wherein the substrate has an opening,
wherein a portion of the opening in the substrate overlaps with the opening in the first resin layer, and
wherein at least a portion of the first conductive layer is exposed through the opening in the substrate.

17. The display device according to claim 10, wherein the transistor comprises an oxide semiconductor in a channel formation region.

18. The display device according to claim 10, wherein the substrate has flexibility.

19. The display device according to claim 10, wherein the first conductive layer comprises an oxide conductor.

20. A module comprising:
the display device according to claim 1; and
a first connection wiring,
wherein the display device comprises a second conductive layer,
wherein the second conductive layer is electrically insulated from the first conductive layer, and
wherein the second conductive layer is electrically connected to the first connection wiring.

21. The module according to claim 20, wherein the second conductive layer overlaps with the substrate with the first conductive layer located therebetween.

22. The module according to claim 20, wherein the second conductive layer overlaps with the substrate with the first conductive layer not located therebetween.

23. The module according to claim 20, further comprising a flexible printed circuit board,
wherein the flexible printed circuit board comprises the first connection wiring and a second connection wiring, and
wherein the first conductive layer is electrically connected to the second connection wiring.

24. An electronic device comprising:
the module according to claim 20; and
at least one of a sensor, an antenna, a battery, a housing, a camera, a speaker, a microphone, and an operation button.

* * * * *